United States Patent
Lee et al.

(10) Patent No.: US 9,171,933 B2
(45) Date of Patent: Oct. 27, 2015

(54) DISPLAY DEVICE AND MANUFACTURING METHOD THEREOF

(71) Applicant: Samsung Display Co., Ltd., Yongin, Gyeonggi-Do (KR)

(72) Inventors: Dae Ho Lee, Seoul (KR); Won Tae Kim, Suwon-si (KR); Kyung Tae Chae, Hwaseong-si (KR); Yong Seok Kim, Seoul (KR); Sung Hwan Won, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 134 days.

(21) Appl. No.: 14/103,579

(22) Filed: Dec. 11, 2013

(65) Prior Publication Data

US 2014/0375937 A1    Dec. 25, 2014

(30) Foreign Application Priority Data

Jun. 25, 2013  (KR) ........................ 10-2013-0072903

(51) Int. Cl.
*G02F 1/1333* (2006.01)
*H01L 29/66* (2006.01)
*G02F 1/1362* (2006.01)
*G02F 1/1341* (2006.01)

(52) U.S. Cl.
CPC .... *H01L 29/66742* (2013.01); *G02F 1/133377* (2013.01); *G02F 1/136209* (2013.01); *G02F 1/1341* (2013.01)

(58) Field of Classification Search
USPC ............................................. 349/44, 110, 154
See application file for complete search history.

(56) References Cited

U.S. PATENT DOCUMENTS

| 7,995,164 B2 * | 8/2011 | Park et al. ...................... 349/110 |
| 2009/0268117 A1 * | 10/2009 | Yamazaki et al. .............. 349/44 |
| 2014/0152948 A1 | 6/2014 | Chae et al. |

FOREIGN PATENT DOCUMENTS

| KR | 10-2013-0134153 A | 12/2013 |
| KR | 10-2014-0025739 A | 3/2014 |
| KR | 10-2014-0094217 A | 7/2014 |

* cited by examiner

*Primary Examiner* — Lucy Chien
(74) *Attorney, Agent, or Firm* — Innovation Counsel LLP

(57) ABSTRACT

A display device includes a plurality of pixel areas and a thin film transistor disposed on a substrate. A first light blocking member is disposed on the thin film transistor, and a contact hole is disposed in the first light blocking member to expose a portion of the thin film transistor. A pixel electrode is disposed on the first light blocking member, and connected with the thin film transistor through the contact hole. A second light blocking member is disposed on the pixel electrode overlapping with the contact hole. A roof layer is disposed spaced apart from the pixel electrode with a microcavity interposed therebetween. An injection hole is disposed below the roof layer to expose a portion of the microcavity, and a liquid crystal layer is disposed in the microcavity. An encapsulation layer is disposed on the roof layer covering the injection hole so as to seal the microcavity.

20 Claims, 19 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2013-0072903 filed on Jun. 25, 2013, the entire contents of which are incorporated herein by reference.

BACKGROUND (a) Technical Field

The present disclosure relates to a display device and a method of manufacturing the display device. More particularly, the present disclosure relates to a display device having a structure that improves the flow of an aligning agent and a liquid crystal material into a microcavity of the display device.

(b) Description of the Related Art

A liquid crystal display is commonly used in flat panel displays. The liquid crystal display typically includes two display panels on which field generating electrodes (such as a pixel electrode and a common electrode) are formed and a liquid crystal layer interposed therebetween. When a voltage is applied to the field generating electrodes, an electric field is generated in the liquid crystal layer. The electric field determines the alignment of liquid crystal molecules in the liquid crystal layer and controls polarization of incident light, thereby allowing images to be displayed on the display panels.

The two display panels in the liquid crystal display may include a thin film transistor array panel and an opposing display panel. The thin film transistor array panel may include a gate line (for transferring a gate signal) and a data line (for transferring a data signal) formed crossing each other, a thin film transistor connected with the gate line and the data line, and a pixel electrode connected with the thin film transistor. The opposing display panel may include a light blocking member, a color filter, and a common electrode. In some cases, the light blocking member, the color filter, and the common electrode may be formed on the thin film transistor array panel.

In a conventional liquid crystal display device, the two display panels are typically formed on two separate substrates. For example, a first substrate is used for the thin film transistor array panel, and a second substrate is used for the opposing display panel. However, using two separate substrates for the display panels may increase the weight and form factor of the liquid crystal display device, as well as process costs and turn-around time.

In some liquid crystal display devices, the two display panels may be integrated onto a single substrate. In those liquid crystal display devices, a light blocking member may be disposed near an injection hole to a microcavity of the display device. When the light blocking member and the injection hole have substantially the same height, flow of an aligning agent and liquid crystal material into the microcavity may be obstructed by the light blocking member, which may lead to an increase in filling time or incomplete filling of the microcavity.

SUMMARY

The present disclosure is directed to address at least the above problems in the related art, by providing a display device having a structure that improves the flow of an aligning agent and liquid crystal material into a microcavity of the display device.

According to some embodiments of the inventive concept, a display device is provided. The display device includes a substrate including a plurality of pixel areas; a thin film transistor disposed on the substrate; a first light blocking member disposed on the thin film transistor; a contact hole disposed in the first light blocking member so as to expose at least a portion of the thin film transistor; a pixel electrode disposed on the first light blocking member, and connected with the thin film transistor through the contact hole; a second light blocking member disposed on the pixel electrode, the second light blocking member overlapping with the contact hole; a roof layer disposed being spaced apart from the pixel electrode with a microcavity interposed therebetween; an injection hole disposed below the roof layer to expose a portion of the microcavity; a liquid crystal layer disposed in the microcavity; and an encapsulation layer disposed on the roof layer covering the injection hole so as to seal the microcavity.

In some embodiments, a height of the second light blocking member may be less than a height of the microcavity.

In some embodiments, a height at the center of the second light blocking member may be greater than a height at an edge of the second light blocking member.

In some embodiments, the height at the edge of the second light blocking member may be less than a height of the microcavity.

In some embodiments, the height at the center of the second light blocking member may be at least the same as the height of the microcavity.

In some embodiments, the display device may further include a color filter disposed below the pixel electrode, and a first insulating layer disposed on the color filter and the first light blocking member.

In some embodiments, the display device may further include a second insulating layer disposed between the pixel electrode and the second light blocking member.

In some embodiments, the display device may further include a common electrode disposed below the roof layer, wherein the common electrode is spaced apart from the pixel electrode with the microcavity interposed therebetween; and a third insulating layer disposed between the common electrode and the roof layer.

In some embodiments, the display device may further include a fourth insulating layer disposed on the roof layer and the second light blocking member.

In some embodiments, a member disposed on the second light blocking member may be formed of a non-conductive material.

According to some other embodiments of the inventive concept, a method of manufacturing a display device is provided. The method includes forming a thin film transistor on a substrate; forming a first light blocking member on the thin film transistor; forming a contact hole by patterning the first light blocking member, so as to expose at least a portion of the thin film transistor; forming a pixel electrode on the patterned first light blocking member, wherein the pixel electrode is connected with the thin film transistor through the contact hole; forming a sacrificial layer on the pixel electrode; patterning the sacrificial layer by removing a portion of the sacrificial layer overlapping with the contact hole; forming a second light blocking member on the pixel electrode and the patterned sacrificial layer; patterning the second light blocking member by removing a portion of the second light blocking member overlapping with the patterned sacrificial layer; forming a roof layer on the patterned sacrificial layer and the patterned second light blocking member; patterning the roof layer so as to form an injection hole for exposing a portion of the patterned sacrificial layer; removing the patterned sacrificial layer so as to form a microcavity between the pixel electrode and the common electrode; injecting a liquid crystal material into the microcavity so as to form a liquid crystal layer; and forming an encapsulation layer on the patterned roof layer so as to seal the microcavity.

In some embodiments, the patterning of the second light blocking member may further include exposing the second light blocking member using a slit mask or a halftone mask, so as to reduce a thickness of the portion of the second light blocking member overlapping with the contact hole.

In some embodiments, the second light blocking member may include a negative photosensitive material, and the slit mask or the halftone mask may include a non-transmitting region corresponding to the patterned sacrificial layer, and a half-transmitting region corresponding to the contact hole.

In some embodiments, a height of the patterned second light blocking member may be less than a height of the microcavity.

In some embodiments, the patterning of the second light blocking member may further include exposing the second light blocking member using a slit mask or a halftone mask, so as to reduce a thickness at an edge of the second light blocking member overlapping with the contact hole.

In some embodiments, the second light blocking member may include a negative photosensitive material, and the slit mask or the halftone mask may include a non-transmitting region corresponding to the patterned sacrificial layer, a half-transmitting region corresponding to a peripheral portion of the contact hole, and a transmitting region corresponding to a center portion of the contact hole.

In some embodiments, a height at the edge of the patterned second light blocking member may be less than a height of the microcavity.

In some embodiments, the method may further include forming a first insulating layer on the patterned first light blocking member; forming a second insulating layer on the pixel electrode and the patterned sacrificial layer; and patterning the second insulating layer using the patterned second light blocking member as a mask.

In some embodiments, the method may further include forming a common electrode on the patterned sacrificial layer and the patterned second light blocking member; forming a third insulating layer on the common electrode; and patterning the common electrode and the third insulating layer using the patterned roof layer as a mask, wherein the patterning of the common electrode and the third insulating layer comprises removing a portion of the common electrode and the third insulating layer formed on the patterned second light blocking member.

In some embodiments, the method may further include forming a fourth insulating layer on the patterned roof layer and the patterned second light blocking member.

DETAILED DESCRIPTION

Figure 1:
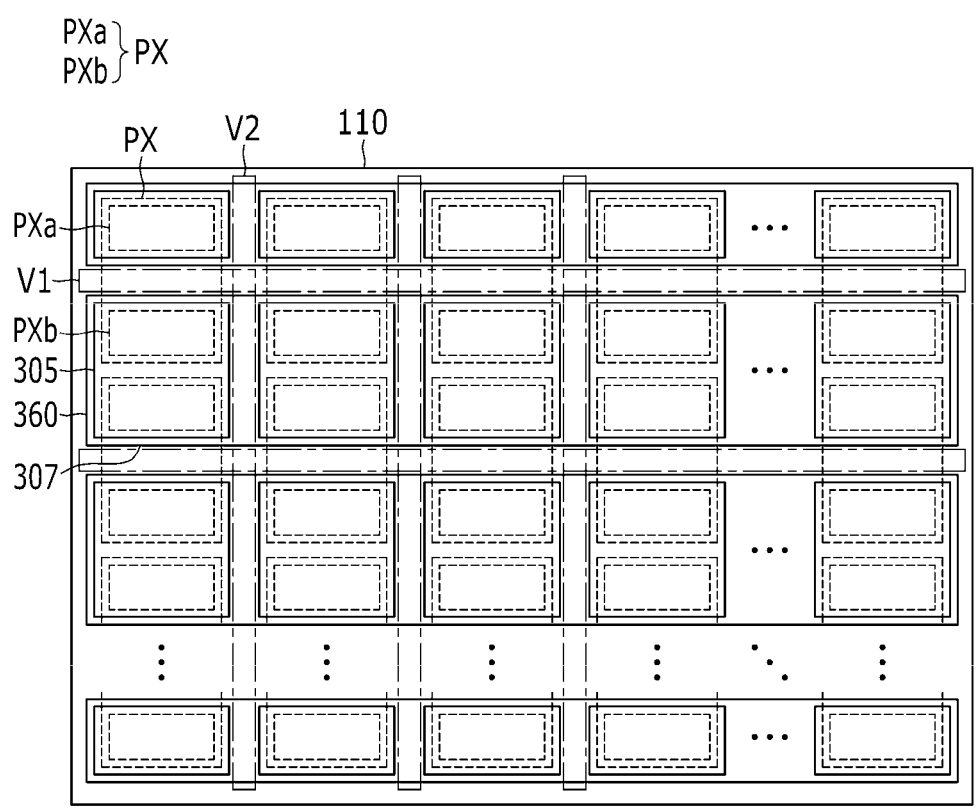
FIG. 1 is a plan view of a display device according to an embodiment of the inventive concept.

The present inventive concept will be described more fully herein with reference to the accompanying drawings, in which exemplary embodiments of the inventive concept are shown. As those skilled in the art would realize, the described embodiments may be modified in various ways without departing from the spirit or scope of the present disclosure.

In the drawings, the thickness of layers, films, panels, regions, etc., may have been exaggerated for clarity. Like reference numerals designate like elements throughout the specification. It will be understood that when an element such as a layer, film, region, or substrate is referred to as being "on" another element, the element can be directly formed on the other element, or formed with intervening elements present. In contrast, when an element is referred to as being "directly on" another element, the element is formed directly on the other element without any intervening elements.

First, a display device according to an embodiment of the inventive concept will be described with reference to FIGS. 1 to 4.

FIG. 1 is a plan view illustrating a display device according to an exemplary embodiment. In the interest of clarity, FIG. 1 focuses on some of the constituent elements in the display device.

Referring to FIG. 1, the display device includes a substrate 110 and a roof layer 360 disposed on the substrate 110. The substrate 110 may be formed of glass or plastic.

The display device includes a plurality of pixel areas PX disposed on the substrate 110. The plurality of pixel areas PX are disposed in a matrix form, and include a plurality of pixel rows and a plurality of pixel columns. Each pixel area PX includes a first subpixel area PXa and a second subpixel area PXb. As shown in FIG. 1, the first subpixel area PXa and the second subpixel area PXb may be vertically disposed.

A first valley V1 is disposed in a pixel row direction between the first subpixel area PXa and the second subpixel area PXb, and a second valley V2 is disposed in a pixel column direction between a plurality of pixel columns The roof layer 360 is disposed in a pixel row direction. In some embodiments, a portion of the roof layer 360 at the first valley V1 is removed, so as to form an injection hole 307 that exposes one or more elements disposed below the roof layer 360.

Figure 3:
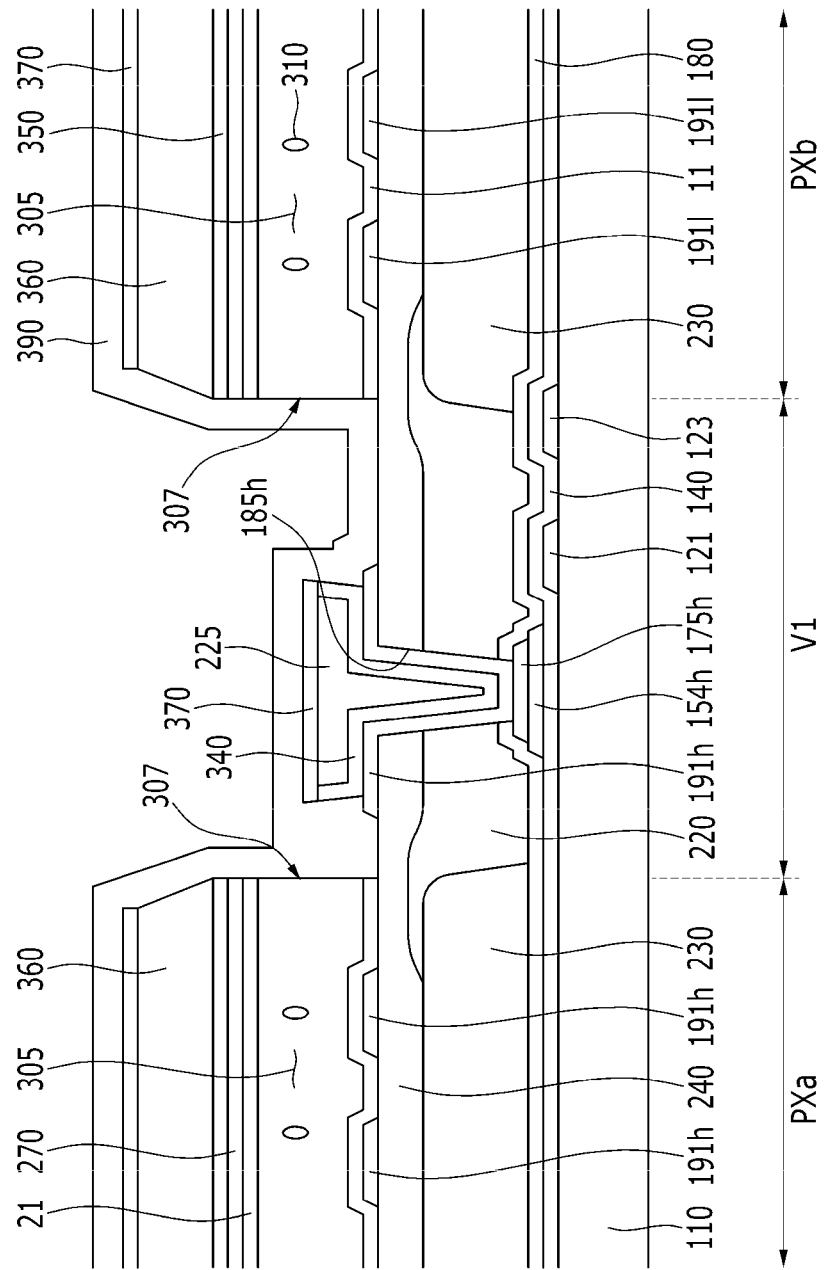
FIG. 3 is a cross-sectional view of the pixel of FIG. 2 taken along line III-III.

As shown in FIG. 1, the display device includes a plurality of roof layers 360 separated from each other (in the pixel row direction) by the second valleys V2. As shown in FIG. 3, a microcavity 305 is formed between the substrate 110 and each roof layer 360. In some embodiments, each roof layer 360 may be attached to the substrate 110 at the second valley V2, covering both sides of the microcavity 305.

It should be noted that the structure of the display device in FIG. 1 is merely exemplary, and may be modified in different ways. For example, the layout of the pixel areas PX, first valleys V1, and second valleys V2 may be modified by connecting the plurality of roof layers 360 to each other at the first valleys V1, and separating a portion of each roof layer 360 from the substrate 110 at the second valleys V2 so as to connect adjacent microcavities 305.

Next, a pixel of the display device of FIG. 1 will be described with reference to FIGS. 2 to 4.

Figure 2:
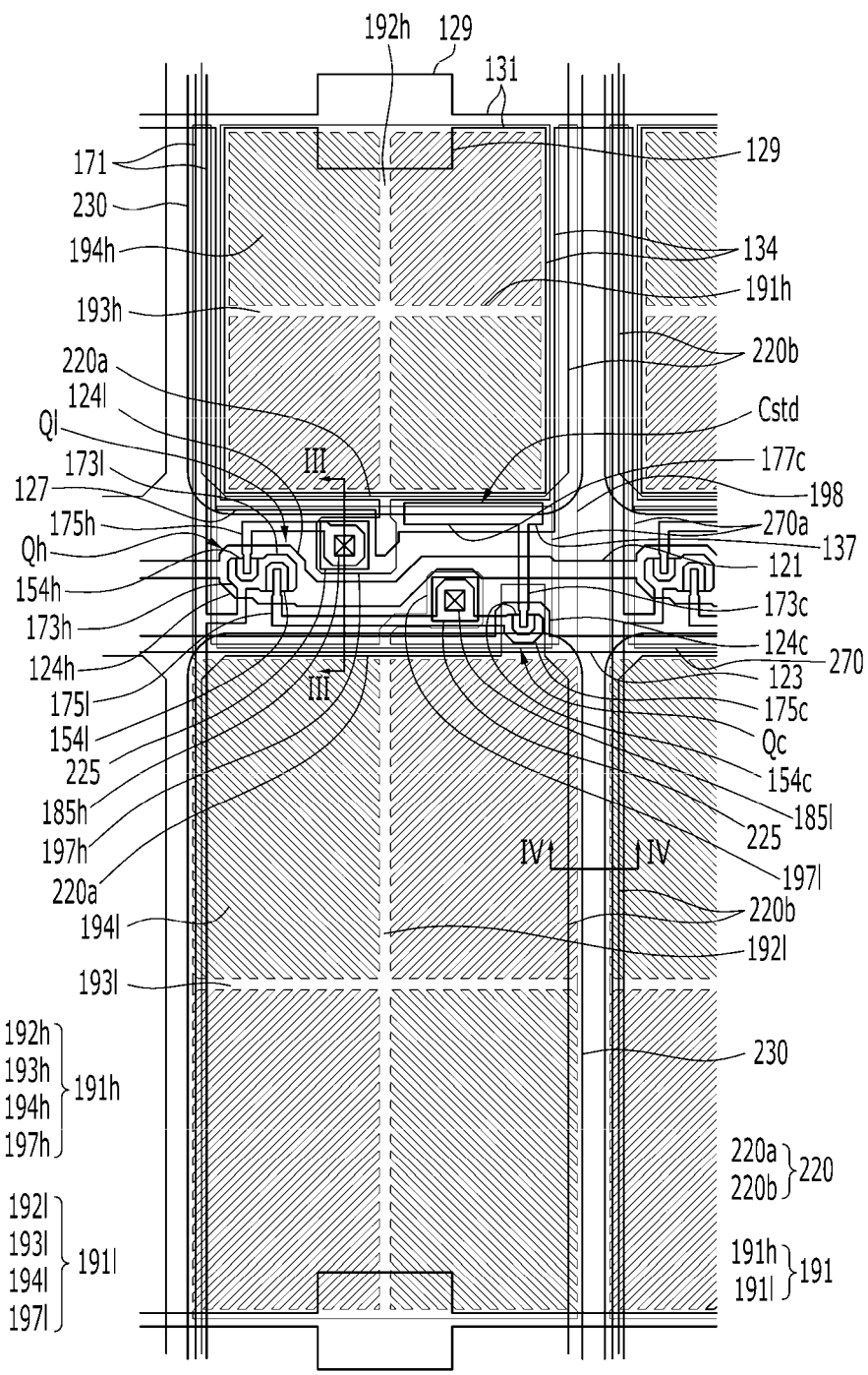
FIG. 2 is a plan view of an exemplary pixel in the display device of FIG. 1.

FIG. 2 is a plan view of a pixel in the display device of FIG. 1. FIG. 3 is a cross-sectional view of the pixel of FIG. 2 taken along line III-III. FIG. 4 is a cross-sectional view of the pixel of FIG. 2 taken along line IV-IV.

Figure 4:
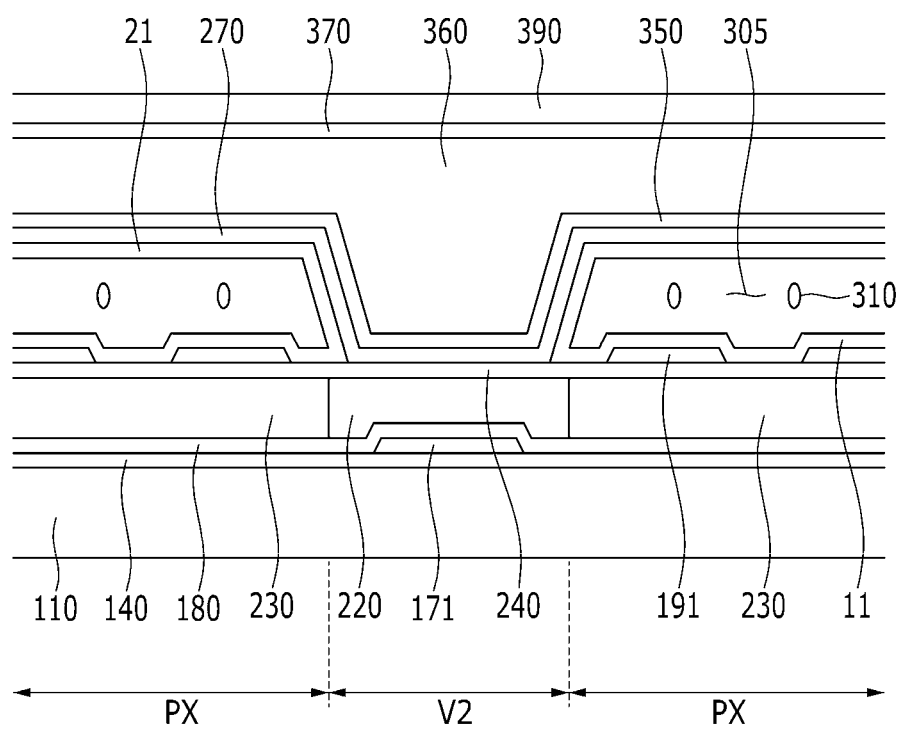
FIG. 4 is a cross-sectional view of the pixel of FIG. 2 taken along line IV-IV.

Referring to FIGS. 2 to 4, the display device includes a plurality of gate conductors disposed on the substrate 110. The gate conductors include a plurality of gate lines 121, a plurality of step-down gate lines 123, and a plurality of storage electrode lines 131.

The gate line 121 and the step-down gate line 123 extend in a substantially horizontal direction, and are configured to transfer gate signals. The gate conductors further include a first gate electrode 124h and a second gate electrode 124l protruding upward and downward respectively from the gate line 121, and a third gate electrode 124c protruding upward from the step-down gate line 123. The first gate electrode 124h and the second gate electrode 124l are connected with each other to form a protrusion. It should be noted that the protrusions (formed by the first, second, and third gate electrodes 124h, 124l, and 124c) may be modified in various ways by one of ordinary skill in the art.

The storage electrode line 131 extends in a substantially horizontal direction, and is configured to transfer a predetermined voltage (such as a common voltage Vcom). As shown in FIG. 2, the storage electrode line 131 includes storage electrodes 129 protruding both upward and downward, a pair of vertical portions 134 extending downward and substantially perpendicular to the gate line 121, and a horizontal portion 127 connecting the ends of the vertical portions 134. The horizontal portion 127 includes a capacitor electrode 137 extending downward.

Referring to FIG. 2, a gate insulating layer 140 (not shown) is disposed on the gate conductors 121, 123, 124h, 124l, 124c, and 131. The gate insulating layer 140 may be formed of an inorganic insulating material such as silicon nitride (SiNx) or silicon oxide (SiOx). In some embodiments, the gate insulating layer 140 may consist of a single layer. In other embodiments, the gate insulating layer 140 may include multiple layers.

A first semiconductor 154h, a second semiconductor 154l, and a third semiconductor 154c are disposed on the gate insulating layer 140. Specifically, the first semiconductor 154h may be disposed on the first gate electrode 124h, the second semiconductor 154l may be disposed on the second gate electrode 124l, and the third semiconductor 154c may be disposed on the third gate electrode 124c. The first semiconductor 154h and the second semiconductor 154l may be connected to each other, and the second semiconductor 154l and the third semiconductor 154c may be connected to each other. In some embodiments, the first semiconductor 154h may extend to a lower portion of the data line 171. The first to third semiconductors 154h, 154l, and 154c may be formed of amorphous silicon, polycrystalline silicon, metal oxide, or other semiconductor materials.

Ohmic contacts (not illustrated) may be disposed on the first to third semiconductors 154h, 154l, and 154c. The ohmic contacts may be formed of silicide, or a material having a high dopant concentration of an n-type impurity (such as n+hydrogenated amorphous silicon).

A data conductor is disposed on the first to third semiconductors 154h, 154l, and 154c. The data conductor includes a data line 171, a first source electrode 173h, a second source electrode 173l, a third source electrode 173c, a first drain electrode 175h, a second drain electrode 175l, and a third drain electrode 175c.

The data line 171 is configured to transfer a data signal, and extends in a substantially vertical direction crossing the gate line 121 and the step-down gate line 123. Each data line 171 includes the first source electrode 173h and the second source electrode 173l. The first source electrode 173h and the second source electrode 173l are connected to each other, and extend toward the first gate electrode 124h and the second gate electrode 124l, respectively.

The first drain electrode 175h and the second drain electrode 175l each includes a rod-shaped end portion, and the third drain electrode 175c includes a wide end portion. The rod-shaped end portions of the first drain electrode 175h and the second drain electrode 175l are partially surrounded by the first source electrode 173h and the second source electrode 173l. The wide end portion of the third drain electrode 175c is bent in the shape of a letter "U", and partially surrounds a rod-shaped end portion of the third source electrode 173c. A wide end portion 177c of the third source electrode 173c overlaps with the capacitor electrode 137 to form a step-down capacitor Cstd.

The first gate electrode 124h, first source electrode 173h, and first drain electrode 175h, together with the first semiconductor 154h, collectively constitute a first thin film transistor Qh. The second gate electrode 124l, second source electrode 173l, and second drain electrode 175l, together with the second semiconductor 154l, collectively constitute a second thin film transistor Ql. The third gate electrode 124c, third source electrode 173c, and third drain electrode 175c, together with the third semiconductor 154c, collectively constitute a third thin film transistor Qc.

The first semiconductor 154h, second semiconductor 154l, and third semiconductor 154c are connected to each other. The first semiconductor 154h, second semiconductor 154l, and third semiconductor 154c may have substantially the same planar shape as the data conductors (171, 173h, 173l, 173c, 175h, 175l, and 175c) and the underlying ohmic contacts, except in the channel regions between the source electrodes 173h, 173l, and 173c and the drain electrodes 175h, 175l, and 175c.

In the first semiconductor 154h, an exposed portion (which is not covered by the first source electrode 173h and the first drain electrode 175h) may be disposed between the first source electrode 173h and the first drain electrode 175h. In the second semiconductor 154l, an exposed portion (which is not covered by the second source electrode 173l and the second drain electrode 175l) may be disposed between the second source electrode 173l and the second drain electrode 175l. In the third semiconductor 154c, an exposed portion (which is not covered by the third source electrode 173c and the third drain electrode 175c) may be disposed between the third source electrode 173c and the third drain electrode 175c.

A passivation layer 180 is disposed on the data conductors (171, 173h, 173l, 173c, 175h, 175l, and 175c) and the exposed portions of the semiconductors 154h, 154l, and 154c. The passivation layer 180 may be formed of an organic insulating material or an inorganic insulating material. The passivation layer 180 may also be formed as a single layer or a multiple-layered structure.

A color filter 230 is disposed on the passivation layer 180 in each pixel area PX. The color filter 230 may display one of the three primary colors red, green, and blue. It should be noted that the color filter 230 is not limited to the three primary colors listed above. In some embodiments, the color filter 230 may display one of cyan, magenta, yellow, and white-based colors. In some embodiments, the color filter 230 may be disposed elongated in a column direction along a space between adjacent data lines 171.

A first light blocking member 220 is disposed in a region between adjacent color filters 230. The first light blocking member 220 is disposed on a boundary of the pixel area PX and a thin film transistor so as to prevent light leakage. A color filter 230 is disposed in each of the first subpixel area PXa and the second subpixel area PXb, with the first light blocking member 220 disposed between the first subpixel area PXa and the second subpixel area PXb.

The first light blocking member 220 includes a horizontal light blocking member 220a extending along the gate line 121 and the step-down gate line 123, and covering regions where the first thin film transistor Qh, second thin film transistor Ql, and third thin film transistor Qc are disposed. The first light blocking member 220 also includes a vertical light blocking member 220b extending along the data line 171. Accordingly, the horizontal light blocking member 220a may be disposed in the first valley V1, and the vertical light blocking member 220b may be disposed in the second valley V2. The color filter 230 and the first light blocking member 220 may be disposed partially overlapping with each other.

Referring to FIG. 3, a first insulating layer 240 may be disposed on the color filter 230 and the first light blocking member 220. The first insulating layer 240 may serve as a planarization layer to reduce a step difference between the color filter 230 and the first light blocking member 220. The first insulating layer 240 may be formed of an organic insulating material. In some embodiments, the first insulating layer 240 may be formed of an inorganic insulating material such as silicon nitride (SiNx) or silicon oxide (SiOx). In some particular embodiments, the first insulating layer 240 may be omitted.

A plurality of first contact holes 185h and a plurality of second contact holes 185l may be formed in the first insulating layer 240, first light blocking member 220, and passivation layer 180. The first contact holes 185h expose the wide end portion of the first drain electrode 175h, and the second contact holes 185l expose the wide end portion of the second drain electrode 175l.

A pixel electrode 191 is disposed on the first insulating layer 240. The pixel electrode 191 may be formed of a transparent metallic material such as indium tin oxide (ITO) or indium zinc oxide (IZO).

The pixel electrode 191 includes the first subpixel electrode 191h and the second subpixel electrode 191l. The first subpixel electrode 191h and the second subpixel electrode 191l are separated from each other, with the gate line 121 and the step-down gate line 123 interposed therebetween. The first subpixel electrode 191h is disposed above the pixel area PX (relative to the gate line 121), and the second subpixel electrode 191l is disposed below the pixel area PX (relative to the step-down gate line 123). The first subpixel electrode 191h and the second subpixel electrode 191l are adjacent to each other in a column direction. As shown in FIG. 3, the first subpixel electrode 191h and the second subpixel electrode 191l are separated from each other with the first valley V1 interposed therebetween, with the first subpixel electrode 191h disposed in the first subpixel area PXa and the second subpixel electrode 191l disposed in the second subpixel area PXb.

The first subpixel electrode 191h and the second subpixel electrode 191l are connected with the first drain electrode 175h and the second drain electrode 175l through the first contact hole 185h and the second contact hole 185l, respectively. Accordingly, when the first thin film transistor Qh and the second thin film transistor Ql are turned on, the first thin film transistor Qh and the second thin film transistor Ql receive data voltages from the first drain electrode 175h and the second drain electrode 175l, respectively.

As shown in FIG. 2, the first subpixel electrode 191h and the second subpixel electrode 191l are shaped as a quadrangle. The first subpixel electrode 191h and the second subpixel electrode 191l include cross stems comprising horizontal stems 193h and 193l, and vertical stems 192h and 192l respectively crossing the horizontal stems 193h and 193l. The first subpixel electrode 191h and the second subpixel electrode 191l include a plurality of minute branches 194h and 194l, and protrusions 197h and 197l protruding downward or upward from the respective edges of the minute branches 194h and 194l.

The pixel electrode 191 is divided into four subregions by the horizontal stems 193h and 193l and vertical stems 192h and 192l. The minute branches 194h and 194l extend obliquely from the horizontal stems 193h and 193l and the vertical stems 192h and 192l, at an angle of approximately 45 degrees or 135 degrees with the gate line 121 or the horizontal stems 193h and 193l. In some embodiments, the minute branches 194h and 194l in adjacent subregions may extend in directions perpendicular to each other.

In an exemplary embodiment, the first subpixel electrode 191h may include an outer stem surrounding the first subpixel electrode 191h. The second subpixel electrode 191l may include horizontal portions disposed at an upper end and a lower end of the second subpixel electrode 191l, and left and right vertical portions 198 disposed at the left and right of the first subpixel electrode 191h. The left and right vertical portions 198 may prevent capacitive coupling between the data line 171 and the first subpixel electrode 191h.

It should be noted that the layout of the pixel electrode, structure of the thin film transistor, and shape of the pixel electrode described above are merely exemplary. Accordingly, the inventive concept is not limited to the above-described embodiments, and may be modified in different ways.

Referring to FIG. 3, a second light blocking member 225 is disposed on the first and second pixel electrodes 191h and 191l, overlapping respectively with a first contact hole 185h and a second contact hole 185l. The second light blocking member 225 is disposed covering the first contact hole 185h and the second contact hole 185l, with the edge of the second light blocking member 225 overlapping with the first light blocking member 220.

It should be noted that when a portion of the first light blocking member 220 is removed at the first contact hole 185h and the second contact hole 185l, light leakage may occur. In particular, a photo-current may be generated as a result of incident light striking the exposed surfaces of the first semiconductor layer 154h and the second semiconductor layer 154l at the first drain electrode 175h and the second drain electrode 175l. In an exemplary embodiment, the second light blocking member 225 is disposed overlapping with the first contact hole 185h and the second contact hole 185l at the first and second thin film transistors Qh and Ql, so as to prevent light leakage and photo-currents from being generated.

A second insulating layer 340 is disposed between the pixel electrode 191 and the second light blocking member 225. The second insulating layer 340 may have substantially the same pattern as the second light blocking member 225, and cover at least one side of the second light blocking member 225. The second insulating layer 340 may be formed of an inorganic insulating material such as silicon nitride (SiNx) or silicon oxide (SiOx). In some particular embodiments, the second insulating layer 340 may be omitted.

A common electrode 270 is disposed above the pixel electrode 191 and spaced apart from the pixel electrode 191 by a predetermined distance. A microcavity 305 is disposed between the pixel electrode 191 and the common electrode 270, and surrounded by the pixel electrode 191 and the common electrode 270. It should be noted that the width and area of the microcavity 305 may be modified accordingly depending on the size and resolution of the display device.

The pixel electrode 270 may be formed of a transparent metallic material such as indium tin oxide (ITO) or indium zinc oxide (IZO). A predetermined voltage may be applied to the common electrode 270, so as to generate an electric field between the pixel electrode 191 and the common electrode 270.

As shown in FIG. 3, a first alignment layer 11 is disposed on the pixel electrode 191 and the portions of the first insulating layer 240 that are not covered by the pixel electrode 191. A second alignment layer 21 is disposed below the common electrode 270 facing the first alignment layer 11. The first alignment layer 11 and the second alignment layer 21 include vertical alignment layers, and may be formed using alignment materials such as polyamic acid, polysiloxane, or polyimide. The first and second alignment layers 11 and 21 may be connected to each other at an edge of the pixel area PX.

A liquid crystal layer comprising liquid crystal molecules 310 is disposed in the microcavity 305 between the pixel electrode 191 and the common electrode 270. The liquid crystal molecules 310 have negative dielectric anisotropy, and may align in a direction perpendicular to the substrate 110 in the absence of an electric field.

An electric field is generated when data voltages are applied to the first subpixel electrode 191h and the second subpixel electrode 191l and a common voltage is applied to the common electrode 270. The electric field determines the directions of the liquid crystal molecules 310 disposed in the microcavity 305 between electrodes 191 and 270. Accordingly, the luminance of light passing through the liquid crystal layer varies depending on the directions of the liquid crystal molecules 310.

Referring to FIG. 3, a third insulating layer 350 is disposed on the common electrode 270. The third insulating layer 350 may be formed of an inorganic insulating material such as silicon nitride (SiNx) or silicon oxide (SiOx). In some particular embodiments, the third insulating layer 350 may be omitted.

A roof layer 360 is disposed on the third insulating layer 350. The roof layer 360 may be formed of an organic material. The microcavity 305 is disposed below the roof layer 360, and the shape of the microcavity 305 may be maintained by strengthening the roof layer 360 through a curing process. As shown in FIG. 3, the roof layer 360 is spaced apart from the pixel electrode 191 with the microcavity 305 interposed therebetween.

The roof layer 360 is disposed in each pixel area PX along a pixel row and the second valley V2. In some embodiments, the roof layer 360 need not be disposed in the first valley V1, and need not be disposed between the first subpixel area PXa and the second subpixel area PXb. The microcavity 305 is disposed below each roof layer 360 in each of the first subpixel area PXa and the second subpixel area PXb. In some embodiments, the microcavity 305 need not be disposed below the roof layer 360 at the second valley V2, and may be disposed directly on the substrate 110 (not shown). Accordingly, a portion of the roof layer 360 at the second valley V2 may have a greater thickness than a portion of the roof layer 360 disposed in the first and second subpixel areas PXa and PXb. It should be noted that an upper surface and both sides of the microcavity 305 may be covered by the roof layer 360.

An injection hole 307 is formed below the roof layer 360 to expose a portion of the microcavity 305. In some embodiments, a plurality of injection holes 307 may be formed facing each other at the edges of the first subpixel area PXa and the second subpixel area PXb. In those embodiments, the injection holes 307 may be disposed on the lower side of the first subpixel area PXa and the upper side of the second subpixel area PXb, so as to expose a side of the microcavity 305. Subsequently, an aligning agent or a liquid crystal material is dispensed at the injection hole 307 so as to fill the microcavity 305 (with the aligning agent or liquid crystal material).

As shown in FIG. 3, the injection hole 307 may be formed having a same height as the microcavity 305. If a height of the second light blocking member 225 is similar to the height of the injection hole 307, the flow of the aligning agent or liquid crystal material near the injection hole 307 may be obstructed by the second light blocking member 225. Accordingly, in the embodiment of FIG. 3, the height of the second light blocking member 225 is less than the height of the microcavity 305, so as to prevent the flow of the aligning agent or liquid crystal material from being obstructed when the alignment agent or liquid crystal material is dispensed at the injection hole 307.

A fourth insulating layer 370 is disposed on the roof layer 360 and the second light blocking member 225. The fourth insulating layer 370 may be formed of an inorganic insulating material such as silicon nitride (SiNx) or silicon oxide (SiOx). The fourth insulating layer 370 may cover the roof layer 360 and the upper side of the second light blocking member 225. The fourth insulating layer 370 serves to protect the roof layer 360, and may cover a side of the roof layer 360. In some particular embodiments, the fourth insulating layer 370 may be omitted.

An encapsulation layer 390 is disposed on the fourth insulating layer 370 covering a portion of the injection hole 307. The encapsulation layer 390 seals the microcavity 305 so that liquid crystal molecules 310 in the microcavity 305 do not escape. Since the encapsulation layer 390 is in contact with the liquid crystal 310, the encapsulation layer 390 may be formed of a material which does not react with the liquid crystal 310. For example, the encapsulation layer 390 may be formed of parylene or other similar materials.

The encapsulation layer 390 may be formed having a multilayer structure such as a double layer and a triple layer structure. The double layer structure includes two layers formed of different materials. The triple layer structure includes three layers having different materials in adjacent layers. For example, the encapsulation layer 390 may include a layer formed of an organic insulating material and a layer formed of an inorganic insulating material.

In an exemplary display device, the fourth insulating layer 370 and the encapsulation layer 390 are disposed on the second light blocking member 225. The fourth insulating layer 370 and the encapsulation layer 390 are formed of non-conductive materials, which minimize the interference effect of secondary electric fields on the first and second thin film transistors Qh and Ql. Accordingly, the secondary electric field effect on the first and second thin film transistors Qh and Ql will be reduced, even though the first and second thin film transistors Qh and Ql are formed overlapping with the second light blocking member 225. Accordingly, the pixel will be smoothly charged.

In some embodiments, polarizers may be disposed on the upper and lower sides of the display device (not illustrated).

The polarizers may include a first polarizer and a second polarizer. The first polarizer may be disposed on the lower side of the substrate 110, and the second polarizer may be disposed on the encapsulation layer 390.

Next, an exemplary method of manufacturing the display device of FIGS. 1 to 4 will be described with reference to FIGS. 5 to 12.

Figure 5:
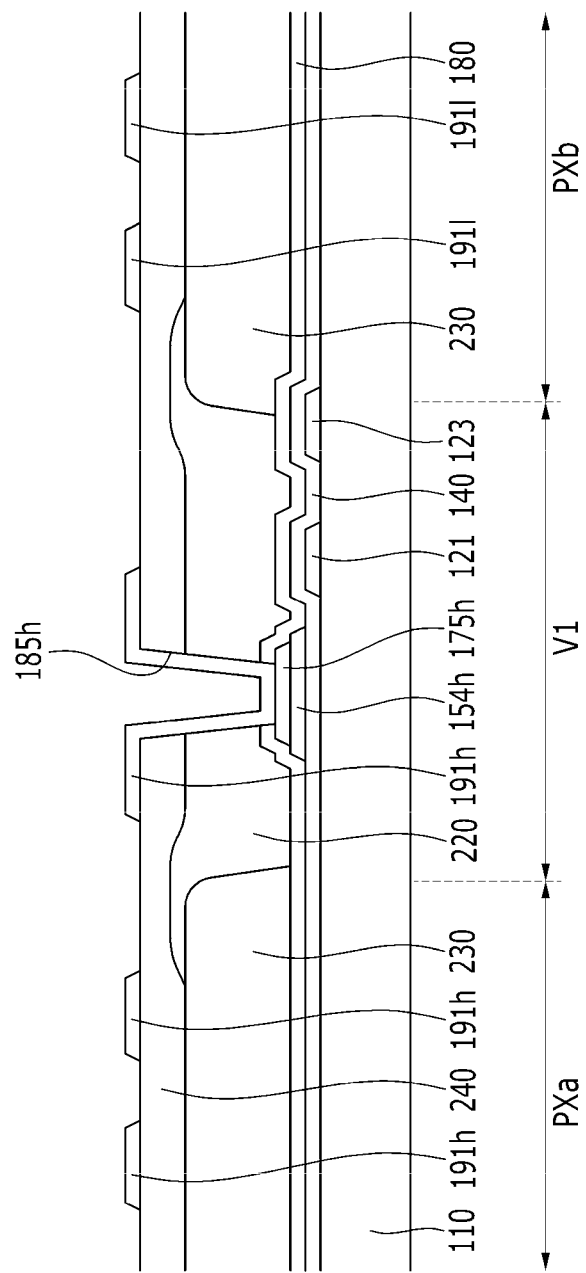
FIGS. 5 to 12 are cross-sectional views illustrating an exemplary method of manufacturing the display device of FIGS. 1 to 4.

First, referring to FIG. 5, a gate line 121 and a step-down gate line 123 are formed on a substrate 110. The substrate 110 may be formed of glass or plastic. The gate line 121 and the step-down gate line 123 may be formed extending in the directions depicted in FIG. 2. In some embodiments (not shown), a first gate electrode 124h, a second gate electrode 124l, and a third gate electrode 124c are formed protruding from the gate line 121. Additionally, a storage electrode line 131 is formed spaced apart from the gate line 121, step-down gate line 123, and first to third gate electrodes 124h, 124l, and 124c.

Next, a gate insulating layer 140 is formed over the surface of the substrate 110, covering the gate line 121, step-down gate line 123, first to third gate electrodes 124h, 124l, and 124c, and storage electrode line 131. The gate insulating layer 140 may be formed of an inorganic insulating material such as silicon oxide (SiOx) or silicon nitride (SiNx). The gate insulating layer 140 may be formed as a single layer or a multiple-layered structure.

Next, a first semiconductor 154h, a second semiconductor 154l, and a third semiconductor 154c are formed by depositing and patterning a semiconductor material (such as amorphous silicon, polycrystalline silicon, or metal oxide) on the gate insulating layer 140. The first semiconductor 154h may be formed on the first gate electrode 124h, the second semiconductor 154l may be formed on the second gate electrode 124l, and the third semiconductor 154c may be formed on the third gate electrode 124c.

Next, a data line 171 is formed by depositing and patterning a metal material on the gate insulating layer 140. The metal material may be formed as a single layer or a multiple-layered structure. As shown in FIG. 2, the data line 171 extends in a direction perpendicular to the gate line 121.

Next, a first source electrode 173h, first drain electrode 175h, second source electrode 173l, second drain electrode 175l, third source electrode 173c, and third drain electrode 175c are formed. As shown in FIG. 2, the first source electrode 173h protrudes above the first gate electrode 124h from the data line 171, and the first drain electrode 175h is spaced apart from the first source electrode 173h. As shown in FIG. 3, the first drain electrode 175h is formed on the first semiconductor 154h. The second source electrode 173l is connected with the first source electrode 173h, and the second drain electrode 175l is spaced apart from the second source electrode 173l. The third source electrode 173c extends from the second drain electrode 175l, and the third drain electrode 175c is spaced apart from the third source electrode 173c.

The first to third semiconductors 154h, 154l, and 154c, data line 171, first to third source electrodes 173h, 173l, and 173c, and first to third drain electrodes 175h, 175l, and 175c may be formed by sequentially depositing and patterning a semiconductor material and a metal material. In an exemplary embodiment, the first semiconductor 154h may extend to a lower portion of the data line 171.

The first gate electrode 124h, first source electrode 173h, and first drain electrode 175h, together with the first semiconductor 154h, collectively form a first thin film transistor Qh. The second gate electrode 124l, second source electrode 173l, and second drain electrode 175l, together with the second semiconductor 154l, collectively form a second thin film transistor Ql. The third gate electrode 124c, third source electrode 173c, and third drain electrode 175c, together with the third semiconductor 154c, collectively form a third thin film transistor Qc.

Next, a passivation layer 180 is formed on the gate insulating layer 140, data line 171, first to third source electrodes 173h/173l/173c, first to third drain electrodes 175h/175l/175c, and the exposed portions of the semiconductors 154h/154l/154c. The passivation layer 180 may be formed of an organic insulating material or an inorganic insulating material, and may be formed as a single layer or a multiple-layered structure.

Next, a color filter 230 is formed in each pixel area PX on the passivation layer 180. As shown in FIG. 5, the color filter 230 is formed in each of the first subpixel area PXa and the second subpixel area PXb, excluding the regions bounded by the first valley V1. Additionally, color filters 230 having a same color may be formed in a column direction of the plurality of pixel areas PX. In forming color filters 230 comprising of three colors, a first color filter 230 having a first color may be formed, and a second color filter 230 having a second color may then be formed by mask-shifting. Similarly, a third color filter 230 having a third color may be formed by mask-shifting.

Next, a first light blocking member 220 is formed on the passivation layer 180 and the thin film transistor, the first light blocking member 220 covering a boundary of each pixel area PX. As shown in FIG. 5, the first light blocking member 220 may be formed at the first valley V1 between the first subpixel area PXa and the second subpixel area PXb.

In the above-described embodiments, the first light blocking member 220 is formed after the color filters 230 have been formed. Nevertheless, the inventive concept is not limited to the above order of formation. For example, in some other embodiments, the first light blocking member 220 may be formed prior to forming the color filters 230.

Next, a first insulating layer 240 is formed on the color filter 230 and the first light blocking member 220. The first insulating layer 240 serves as a planarization layer for reducing a step difference between the color filter 230 and the light blocking member 220. In some embodiments, the first insulating layer 240 may be formed of an organic insulating material. In other embodiments, the first insulating layer 240 may be formed of an inorganic insulating material such as silicon nitride (SiNx) or silicon oxide (SiOx).

Next, a first contact hole 185h is formed by etching the passivation layer 180, first light blocking member 220, and first insulating layer 240, so as to expose a portion of the first drain electrode 175h. A second contact hole 185l is similarly formed so as to expose a portion of the second drain electrode 175l.

Next, a first subpixel electrode 191h is formed in the first subpixel area PXa, and a second subpixel electrode 191l is formed in the second subpixel area PXb. The first subpixel electrode 191h and the second subpixel electrode 191l are formed by depositing and patterning a transparent metallic material (such as indium tin oxide (ITO) or indium zinc oxide (IZO)) on the first insulating layer 240. The first subpixel electrode 191h and the second subpixel electrode 191l are separated from each other with the first valley V1 interposed therebetween. The first subpixel electrode 191h is connected to the first drain electrode 175h through the first contact hole 185h, and the second subpixel electrode 191l is connected to the second drain electrode 175l through the second contact hole 185l.

Next, horizontal stems 193h and 193l are formed in the first subpixel electrode 191h, and vertical stems 192h and 192l (crossing the horizontal stems 193h and 193l) are formed in the second subpixel electrode 191l. A plurality of minute branches 194h and 194l are formed extending obliquely from the horizontal stems 193h and 193l and the vertical stems 192h and 192l.

Figure 6:
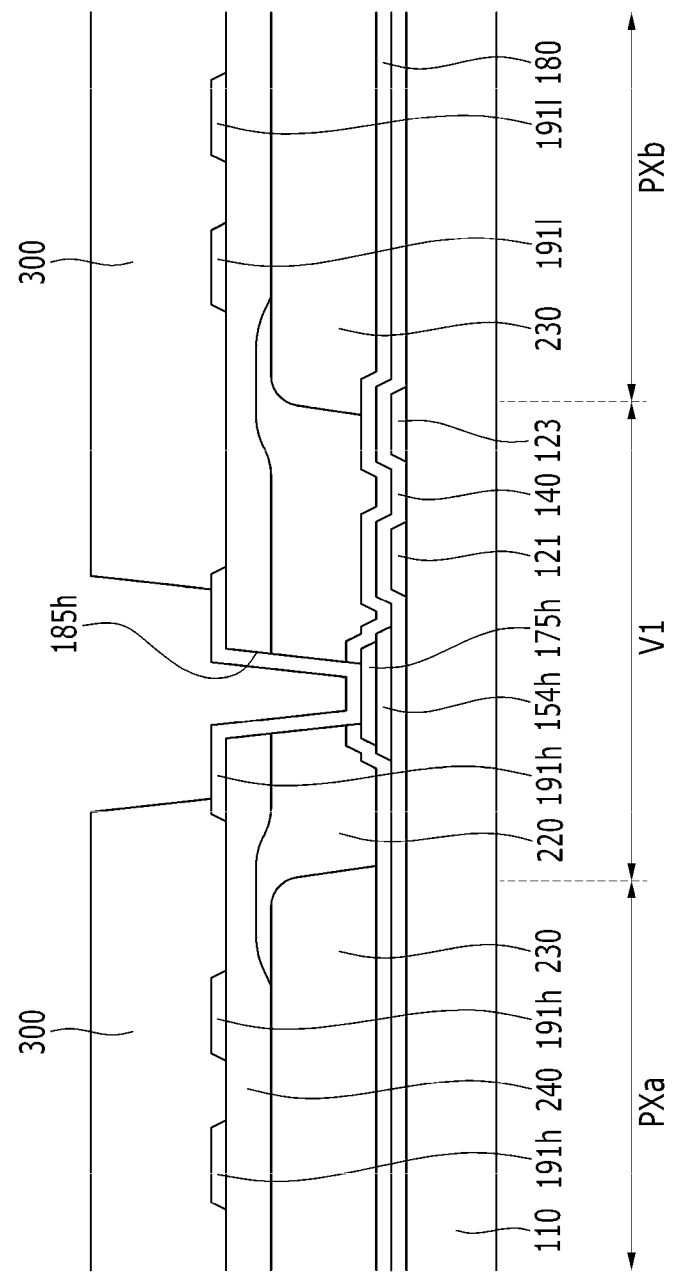

As illustrated in FIG. 6, a sacrificial layer 300 is formed by coating a photosensitive organic material on the pixel electrode 191, and patterning the photosensitive organic material through a photolithography process.

A plurality of sacrificial layers 300 are formed connected to each other along the plurality of pixel columns. Thus, the sacrificial layer 300 is formed covering each pixel area PX as well as the first valley V1 disposed between the first subpixel area PXa and the second subpixel area PXb. The sacrificial layer 300 is formed such that portions of the sacrificial layer 300 (overlapping with the first contact hole 185h and the second contact hole 185l) are removed.

Figure 7:
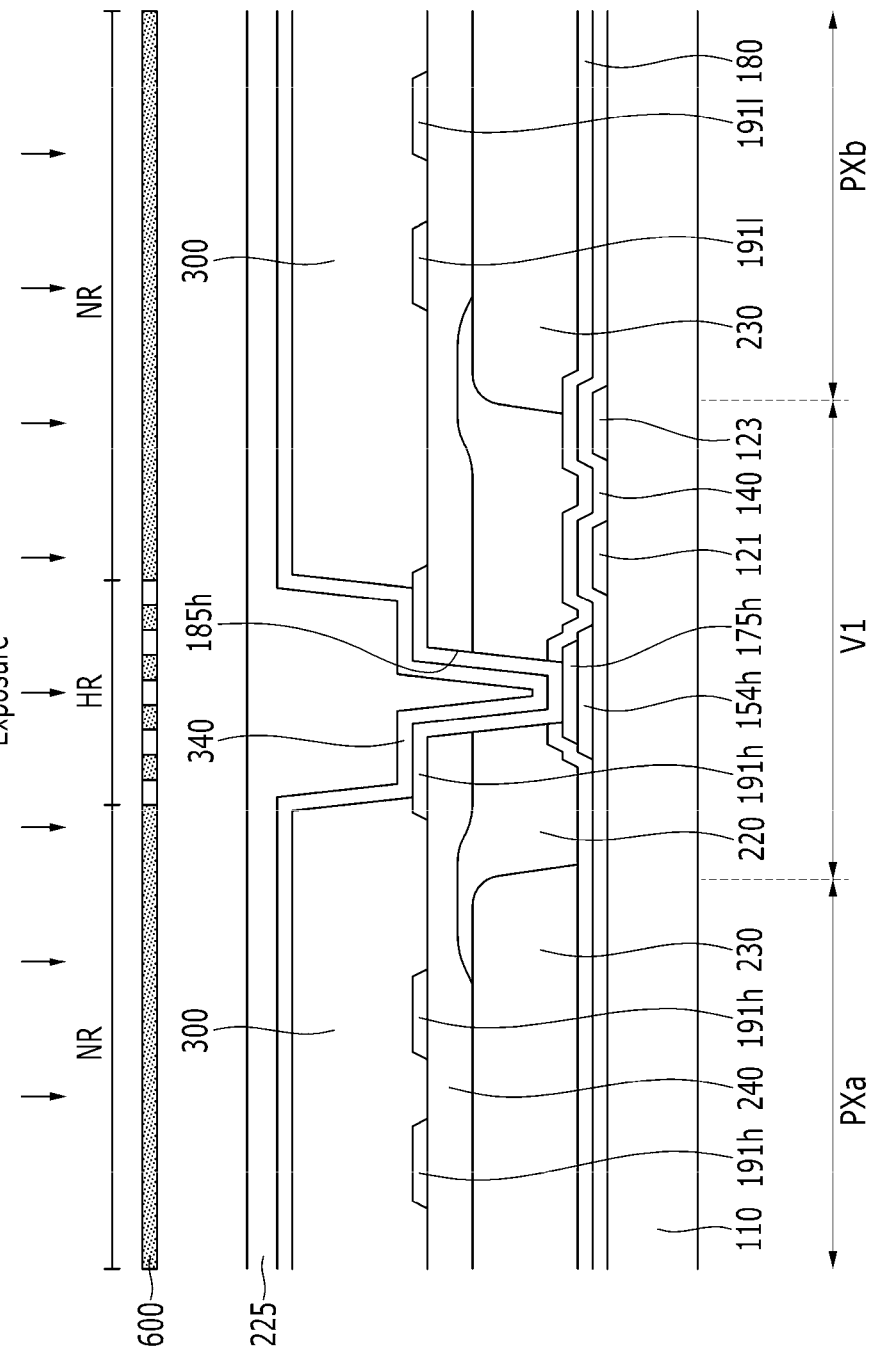
Figure 8:
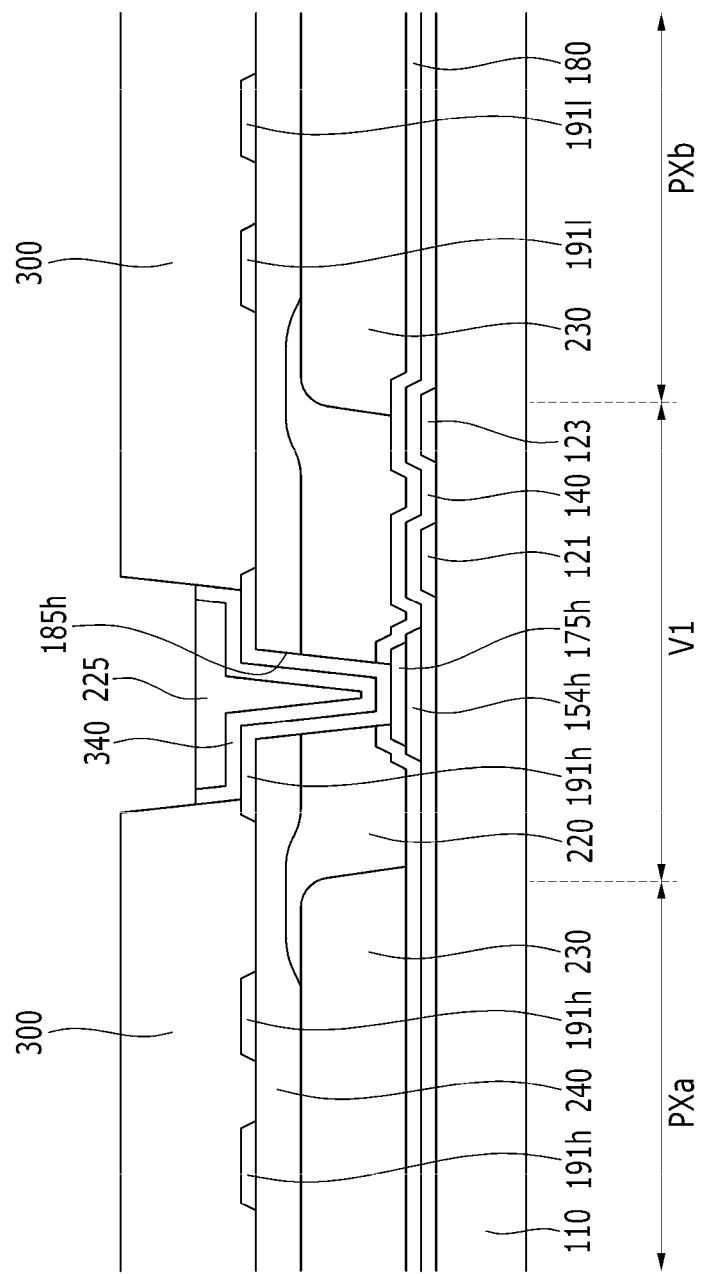

Referring to FIGS. 7 and 8, a second insulating layer 340 is formed on the pixel electrode 191 and the sacrificial layer 300. The second insulating layer 340 may be formed of an inorganic insulating material such as silicon nitride (SiNx) or silicon oxide (SiOx).

Next, a second light blocking member 225 is formed on the second insulating layer 340. The second light blocking member 225 is patterned using a photolithography process, which includes exposing the second light blocking member 225 through a mask 600 (FIG. 7) and developing the exposed portions, as described in further detail below.

The mask 600 may include a slit mask or a halftone mask. The mask 600 includes a non-transmitting region NR (corresponding to the sacrificial layer 300) and a half-transmitting region HR (corresponding to the first contact hole 185h and the second contact hole 185l). In an embodiment where the mask 600 includes a slit mask, the half-transmitting region HR may be formed having a slit-like shape.

Since light does not pass through the non-transmitting region NR of the mask 600, the portion of the second light blocking member 225 directly below the non-transmitting region NR will not be exposed. However, some light is allowed to pass through the half-transmitting region HR of the mask 600. Accordingly, the portion of the second light blocking member 225 directly below the half-transmitting region HR will be partially exposed.

When the second light blocking member 225 is formed of a negative photosensitive material, the non-exposed portion of the second light blocking member 225 will be removed during development, while the exposed portion of the second light blocking member 225 remains. Accordingly, the (non-exposed) portion of the second light blocking member 225 on the sacrificial layer 300 will be removed, whereas the (partially exposed) portion of the second light blocking member 225 overlapping with the first contact hole 185h and the second contact hole 185l remains. As shown in FIG. 8, after the photolithography process, the resulting second light blocking member 225 has a lower thickness (relative to the original second light blocking member 225) at the partially exposed portion, since some of the partially exposed portion was removed during development.

Next, the second insulating layer 340 is patterned using the resulting second light blocking member 225 as a mask. Accordingly, the second insulating layer 340 may be formed having substantially the same pattern as the second light blocking member 225. As shown in FIG. 8, the second insulating layer 340 is formed covering at least a lower surface and a side of the second light blocking member 225.

Figure 9:
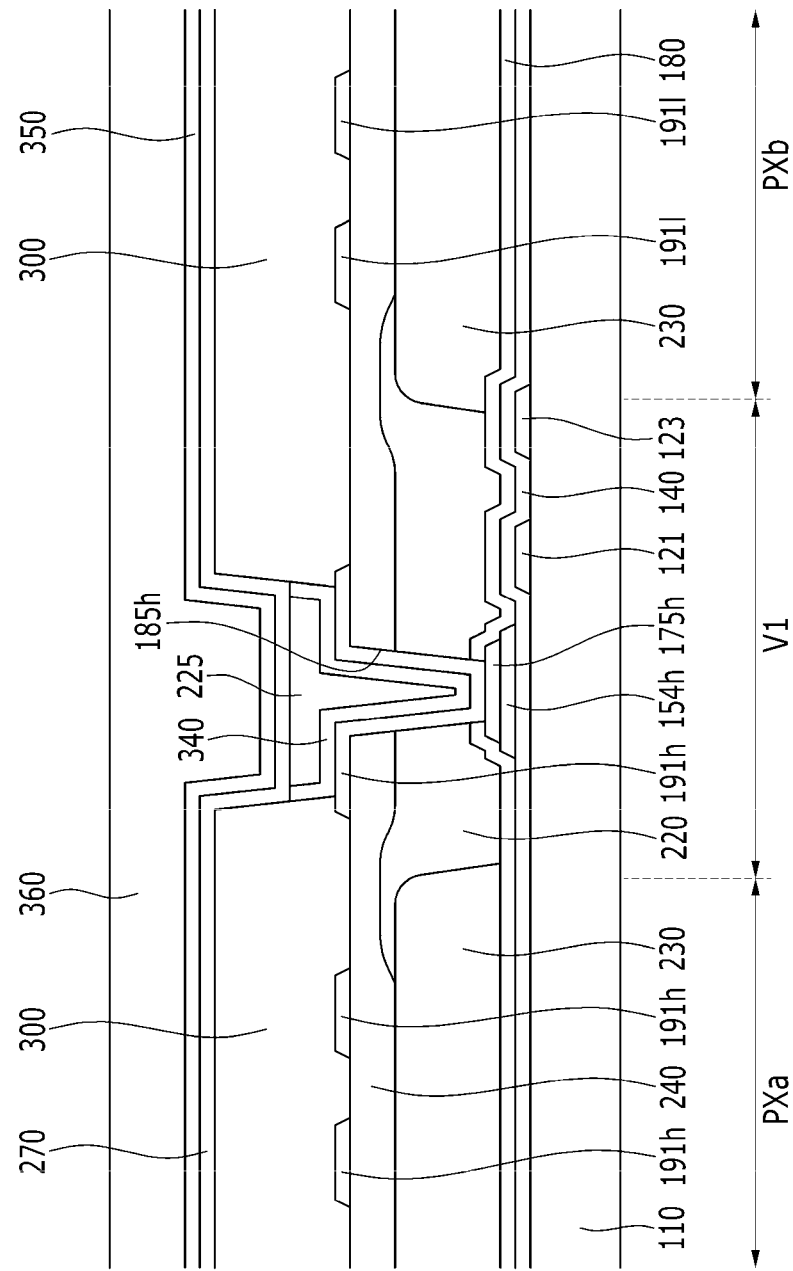

As illustrated in FIG. 9, a common electrode 270 is formed by depositing a transparent metallic material (such as indium tin oxide (ITO) or indium zinc oxide (IZO)) on the sacrificial layer 300 and the second light blocking member 225.

Next, a third insulating layer 350 is formed on the common electrode 270. The third insulating layer 350 may be formed of an inorganic insulating material such as silicon nitride (SiNx) or silicon oxide (SiOx).

Figure 10:
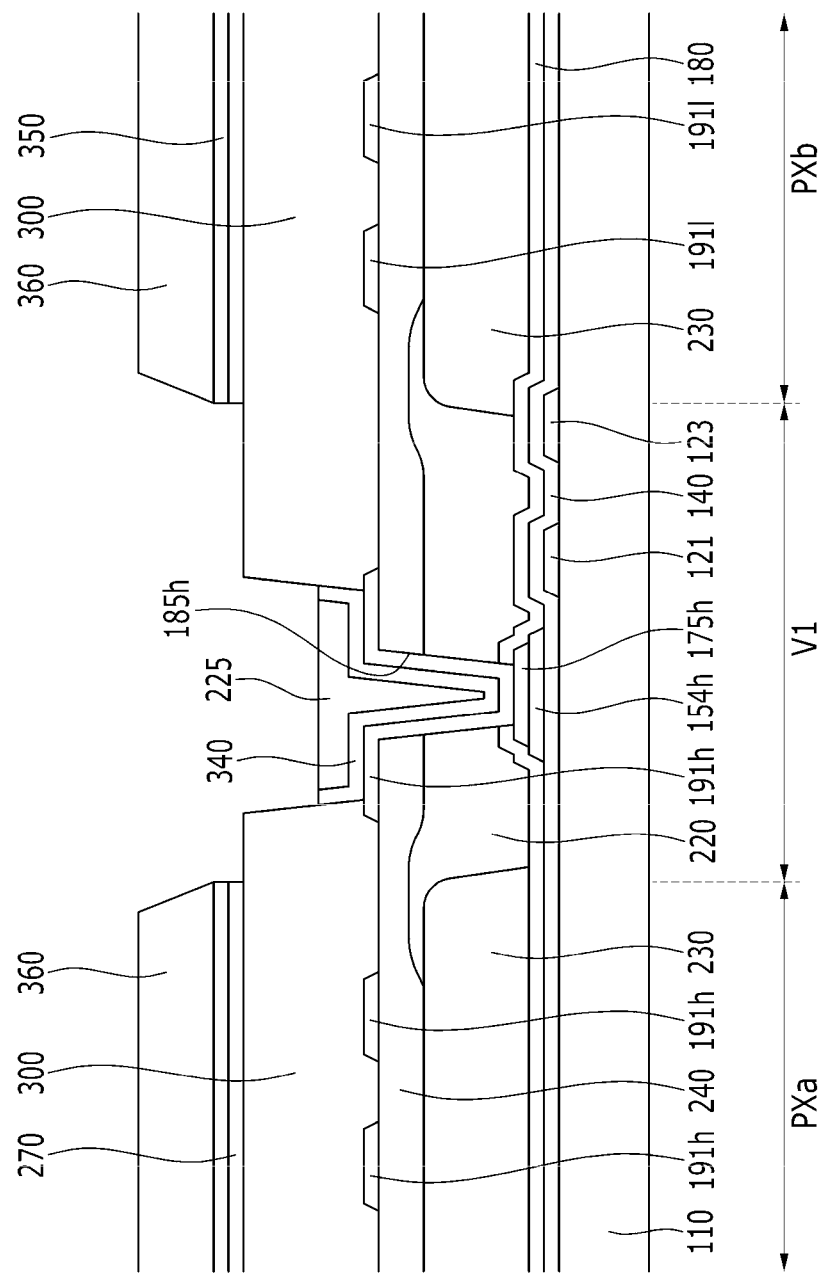

Next, a roof layer 360 is formed by coating and patterning an organic material on the third insulating layer 350. As illustrated in FIG. 10, the portion of the roof layer 360 disposed at the first valley V1 has been removed using a photolithography process. As a result, a plurality of roof layers 360 may be formed connected to each other along a plurality of pixel rows.

Next, the common electrode 270 and the third insulating layer 350 are patterned using the roof layer 360 as a mask. Accordingly, the portions of the common electrode 270 and the third insulating layer 350 at the first valley V1 are removed after the patterning.

It should be noted that when the second light blocking member 225 is disposed directly above the first and second thin film transistors Qh and Ql, and the common electrode 270 is formed on the second light blocking member 225, a secondary electric field effect may be generated on the first and second thin film transistors Qh and Ql, which may impact charging of the pixel. However, as shown in FIG. 10, the portion of the common electrode 270 originally disposed on the second light blocking member 225 has been removed. Accordingly, in the embodiment of FIG. 10, the secondary electric field effect on the first and second thin film transistors Qh and Ql can be reduced, thereby leading to smoother charging of the pixel.

Figure 11:
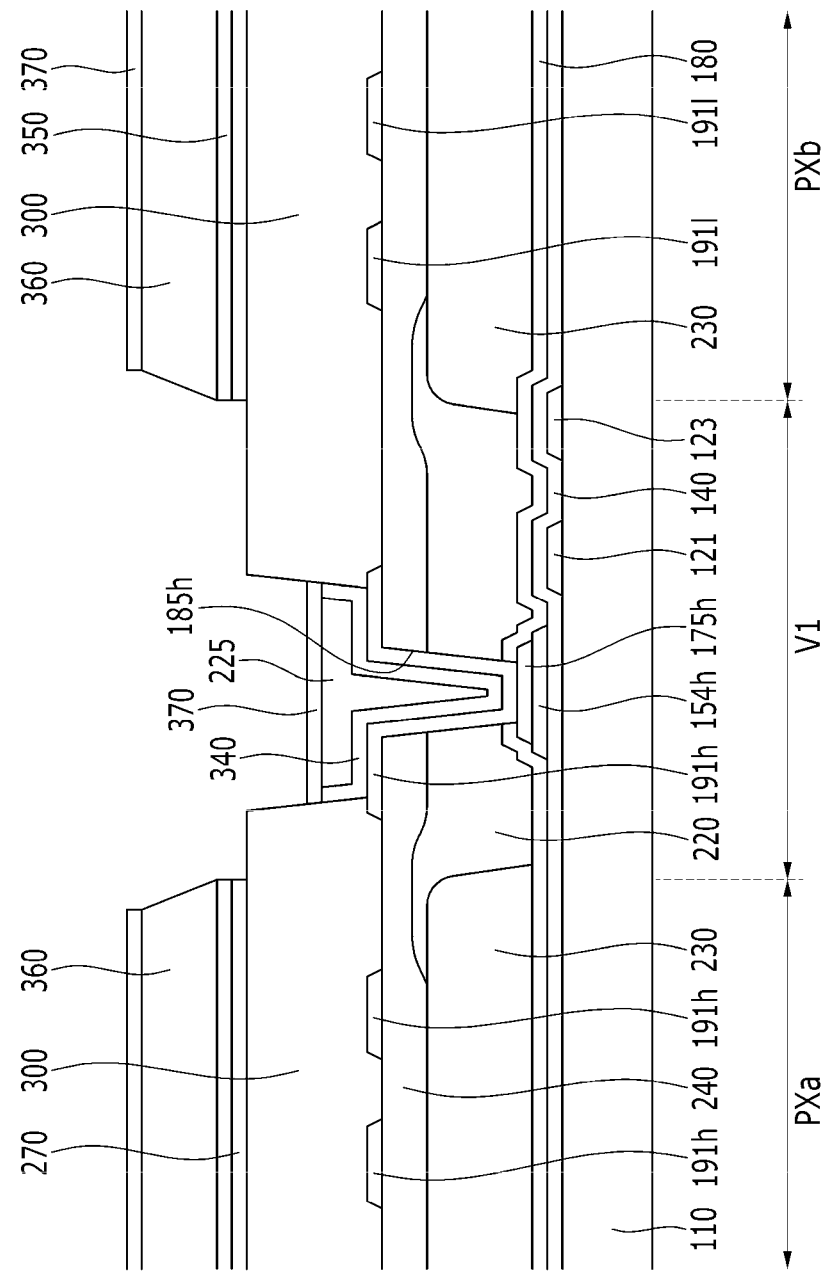

Referring to FIG. 11, a fourth insulating layer 370 is formed over the structure of FIG. 10. The fourth insulating layer 370 may be formed of an inorganic insulating material such as silicon nitride (SiNx) or silicon oxide (SiOx). Next, the portion of the fourth insulating layer 370 at the first valley V1 is removed, except for the portion of the fourth insulating layer 370 directly above the first contact hole 185h and the second contact hole 185l. As shown in FIG. 11, the fourth insulating layer 370 is disposed on the roof layer 360 and the second light blocking member 225 (after the patterning of the fourth insulating layer 370).

In the embodiment of FIG. 11, the fourth insulating layer 370 is formed covering the top surface of the roof layer 360 and the upper surface of the second light blocking member 225. However, the inventive concept is not limited to the above-described embodiment. In some other embodiments, the fourth insulating layer 370 may be formed covering a side surface of the roof layer 360.

Figure 12:
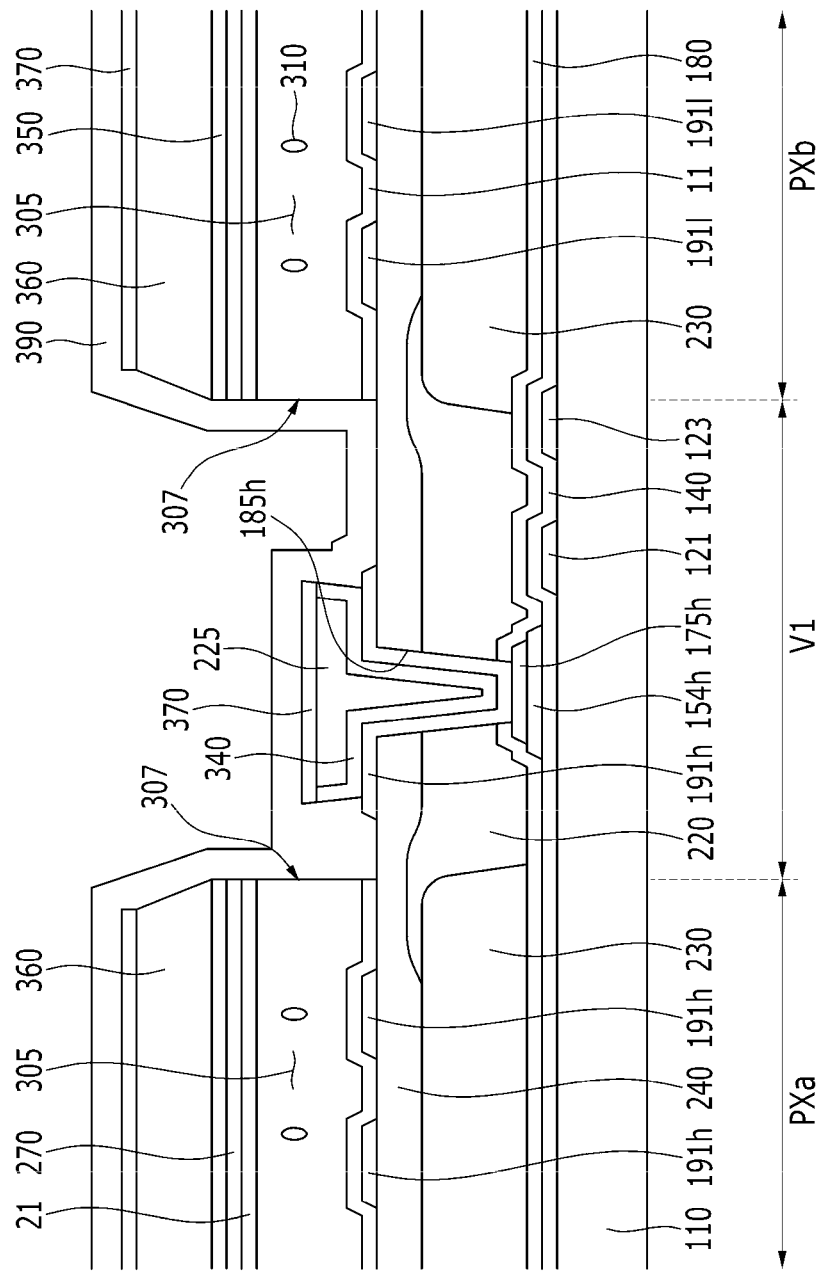

Referring to FIGS. 11 and 12, the sacrificial layer 300 is removed by applying a developer and a stripping solution onto areas of the substrate 110 where the sacrificial layer 300 is exposed. In some embodiments, the sacrificial layer 300 may be removed using an ashing process.

After the sacrificial layer 300 has been removed, a microcavity 305 is formed in the space where the sacrificial layer 300 was previously located.

The pixel electrode 191 and the common electrode 270 are spaced apart from each other with the microcavity 305 interposed therebetween. The pixel electrode 191 and the roof layer 360 are also spaced apart from each other with the microcavity 305 interposed therebetween. The common electrode 270 and the roof layer 360 are formed covering the upper surface and both sides of the microcavity 305.

The microcavity 305 is exposed to the outside via the injection hole 307. The injection hole 307 corresponds to a portion where the roof layer 360, third insulation layer 350, and common electrode 270 have been removed. The injection hole 307 may be formed along the first valley V1. A plurality of injection holes 307 may be formed facing each other at the edges of the first subpixel area PXa and the second subpixel area PXb. As such, the injection holes 307 may be disposed at the lower side of the first subpixel area PXa and the upper side of the second subpixel area PXb, so as to expose a side of the microcavity 305. (See FIG. 1). In some other embodiments, the injection hole 307 may be formed along the second valley V2.

Next, the roof layer 360 is cured by applying heat to the substrate 110. By strengthening the roof layer 360 through curing, the shape of the microcavity 305 can be maintained.

Next, an aligning agent including an alignment material is dispensed on the substrate 110 using a spin coating method or an inkjet method. The aligning agent flows into the microcavity 305 through the injection hole 307. After the aligning agent flows into the microcavity 305, a curing process is performed. The curing process causes the solution component of the aligning agent to evaporate, which then leaves the alignment material on the inner walls of the microcavity 305. Accordingly, the first alignment layer 11 is formed on the pixel electrode 191, and the second alignment layer 21 is formed below the common electrode 270. The first alignment layer 11 and the second alignment layer 21 are formed facing each other with the microcavity 305 interposed therebetween. The first alignment layer 11 and the second alignment layer 21 are connected to each other at an edge of the pixel area PX.

In some embodiments, the first and second alignment layers 11 and 21 may be aligned in a direction perpendicular to the substrate 110, except at the regions near the side of the microcavity 305. In some further embodiments, a UV irradiation process may be performed on the first and second alignment layers 11 and 21, so as to align the first and second alignment layers 11 and 21 in a direction parallel to the substrate 110.

Next, a liquid crystal material comprising liquid crystal molecules 310 is dispensed on the substrate 110 using an inkjet method or a dispensing method. The liquid crystal material flows into the microcavity 305 through the injection hole 307. In some embodiments, the liquid crystal material may be dispensed at the injection holes 307 along the odd-numbered first valleys V1 instead of the injection holes 307 along the even-numbered first valleys V1. In some other embodiments, the liquid crystal material may be dispensed at the injection holes 307 along the even-numbered first valleys V1 instead of the injection holes 307 along the odd-numbered first valleys V1.

When the liquid crystal material is dispensed at the injection holes 307 along the odd-numbered first valleys V1, the liquid crystal material flows into the microcavity 305 via capillary force. As the liquid crystal material fills the space in the microcavity 305, air is discharged from the microcavity 305 through the liquid crystal injection holes 307 along the even-numbered first valleys V1.

In some embodiments, the liquid crystal material may be dispensed at all the injection holes 307. In those embodiments, the liquid crystal material may be dispensed at the injection holes 307 along the odd-numbered first valleys V1 and the injection holes 307 along the even-numbered first valleys V1.

As previously described, the aligning agent and the liquid crystal material flows through the injection hole 307, and the second light blocking member 225 is formed around the injection hole 307. Accordingly, when the height of the second light blocking member 225 is increased, the flow of the aligning agent and the liquid crystal material into the injection hole 307 may be obstructed. In an exemplary embodiment, the thickness of the second light blocking member 225 is reduced by using a slit mask, which results in the second light blocking member 225 having a lower height than the microcavity 305. Accordingly, the aligning agent or the liquid crystal material can more easily flow through the injection hole 307 into the microcavity 305.

Next, an encapsulation layer 390 is formed by depositing on the fourth insulating layer 370 a material which does not react with the liquid crystal molecules 310. The encapsulation layer 390 is formed covering the injection hole 307 so as to seal the microcavity 305.

Next, although not illustrated, polarizers may be further formed on the upper and lower sides of the display device. The polarizers may include a first polarizer and a second polarizer. The first polarizer may be formed on the lower surface of the substrate 110, and the second polarizer may be formed on the encapsulation layer 390.

Next, a display device according to another exemplary embodiment of the inventive concept will be described with reference to FIG. 13.

Figure 13:
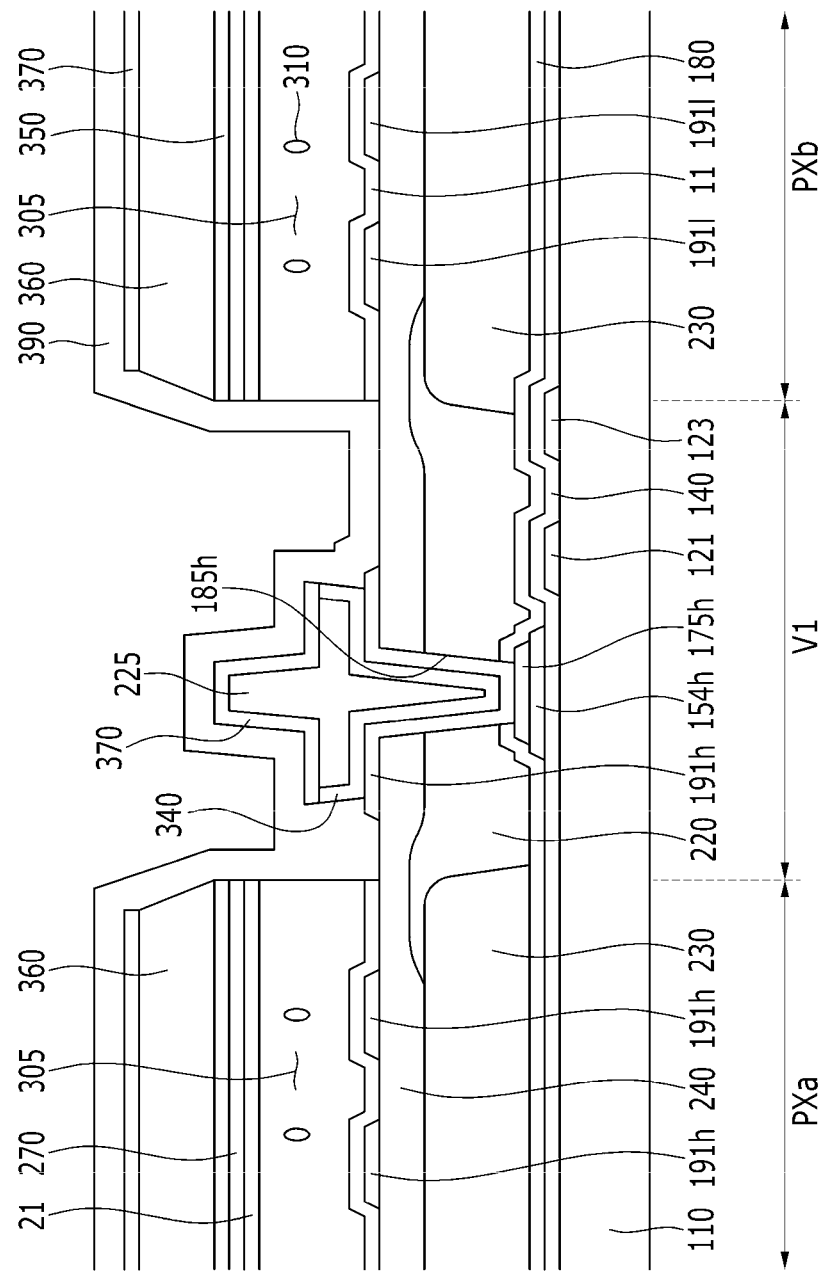
FIG. 13 is a cross-sectional view illustrating a portion of a display device according to another embodiment of the inventive concept.

The display device in FIG. 13 includes elements similar to those previously described in FIGS. 1 to 4, and therefore detailed description of those elements shall be omitted.

Referring to FIG. 13, a first thin film transistor Qh and a second thin film transistor Ql are formed on a substrate 110. A first light blocking member 220 is formed on the first and second thin film transistors Qh and Ql. First and second contact holes 185h and 185l are formed in the first light blocking member 220, so as to expose at least a portion of the first and second thin film transistors Qh and Ql. A first pixel electrode 191h and a second pixel electrode 191l are connected with the first and second thin film transistors Qh and Ql, respectively, through the first and second contact holes 185h and 185l.

A second light blocking member 225 is formed on the first and second pixel electrodes 191h and 191l, the second light blocking member 225 overlapping with the first contact hole 185h and the second contact hole 185l. A roof layer 360 is formed above the first and second pixel electrodes 191h and 191l, with a microcavity 305 interposed therebetween. An injection hole 307 is formed below the roof layer 360 so as to expose a portion of the microcavity 305. A liquid crystal layer comprising liquid crystal molecules 310 is dispensed at the injection hole 307 so as to fill the microcavity 305. An encapsulation layer 390 is formed on the roof layer 360 covering the injection hole 307, so as to seal the microcavity 305.

Referring to FIG. 13, it is noted that the heights at the center and edge of the second light blocking member 225 are different. Specifically, the height of the second light blocking member 225 is greater at the center than at the edge. As shown in FIG. 13, the edge of the second light blocking member 225 overlaps with the first light blocking member 220. Thus, even though the edge of the second light blocking member 225 has a low thickness (relative to the center), light can be effectively blocked by the first light blocking member 220. Furthermore, although the center of the second light blocking member 225 does not overlap with the first light blocking member 220, light can still be effectively blocked by increasing the thickness of the second light blocking member 225 at its center. Accordingly, the height at the center of the second light blocking member 225 may be greater than the height of the microcavity 305. In some embodiments, the height at the center of the second light blocking member 225 may be substantially the same as the height of the microcavity 305.

As previously mentioned, the height of an injection hole may correspond to a height of a microcavity, and flow of an aligning agent or liquid crystal material into the microcavity may be obstructed by a light blocking member. Accordingly, in the embodiment of FIG. 13, the height at the edge of the second light blocking member 225 is less than the height of the microcavity 305. As a result, the aligning agent or the liquid crystal material can flow more easily into the microcavity 305 through the injection hole 307 (due to the reduced height at the edge of the second light blocking member 225).

Next, a method of manufacturing the display device of FIG. 13 will be described with reference to FIGS. 14 to 19. The method in FIGS. 14 to 19 includes elements/steps that are similar those previously described in the method of FIGS. 5 to 12, and therefore detailed description of those similar elements/steps shall be omitted.

Figure 14:
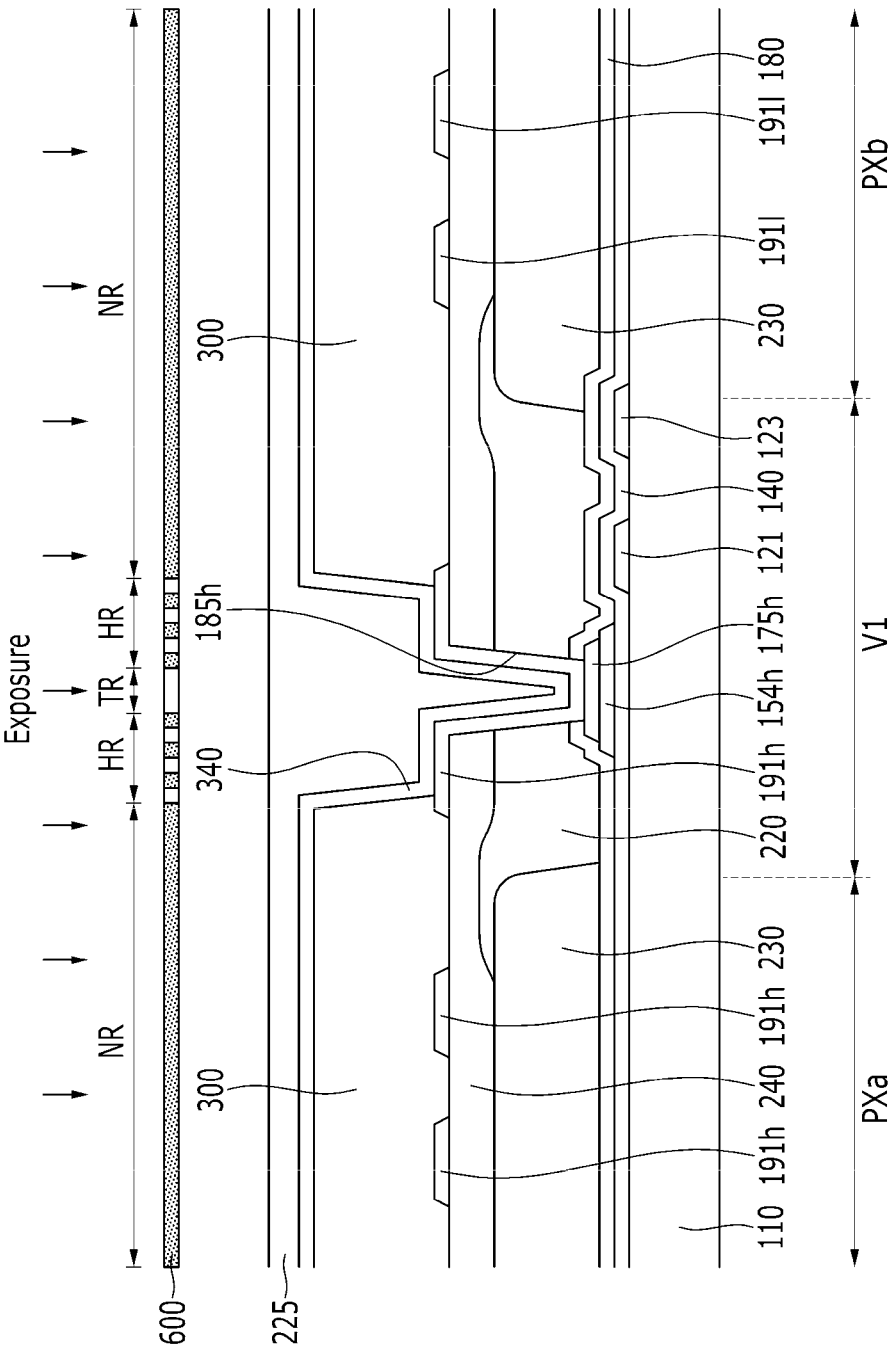
FIGS. 14 to 19 are cross-sectional views illustrating an exemplary method of manufacturing the display device of FIG. 13.

Referring to FIG. 14, first to third thin film transistors Qh/Ql/Qc are formed on a substrate 110, and a first light blocking member 220 is formed on the first to third thin film transistors Qh/Ql/Qc. First and second contact holes 185*h* and 185*l* are formed by patterning the first light blocking member 220. The first and second contact holes 185*h* and 185*l* expose at least a portion of the respective first and second thin film transistors Qh and Ql.

Next, first and second pixel electrodes 191*h* and 191*l* are formed connecting with the first and second thin film transistors Qh and Ql through the first and second contact holes 185*h* and 185*l*. A sacrificial layer 300 is formed and patterned on the first and second pixel electrodes 191*h* and 191*l*. The patterning of the sacrificial layer 300 includes removing a portion of the sacrificial layer 300 overlapping with the first and second contact holes 185*h* and 185*l*.

Next, a second insulating layer 340 is formed on the pixel electrode 191 and the sacrificial layer 300, and a second light blocking member 225 is formed on the second insulating layer 340. The second light blocking member 225 is patterned using a photolithography process, which includes exposing the second light blocking member 225 using a mask 600 (FIG. 14) and developing the exposed portions, as described in further detail below.

The mask 600 may include a slit mask or a halftone mask. The mask 600 includes a non-transmitting region NR (corresponding to the sacrificial layer 300), a half-transmitting region HR (corresponding to the first contact hole 185*h* and the second contact hole 185*l*), and a transmitting region TR (corresponding to a peripheral portion of the first and second contact holes 185*h* and 185*l*). In an embodiment where the mask 600 includes a slit mask, the half-transmitting region HR may be formed having a slit-like shape.

Since light does not pass through the non-transmitting region NR of the mask 600, the portion of the second light blocking member 225 directly below the non-transmitting region NR will not be exposed. However, some light is allowed to pass through the half-transmitting region HR of the mask 600, and light fully passes through the transmitting region TR of the mask 600. Accordingly, the portion of the second light blocking member 225 directly below the half-transmitting region HR will be partially exposed, and the portion of the second light blocking member 225 directly below the transmitting region TR will be fully exposed.

Figure 15:
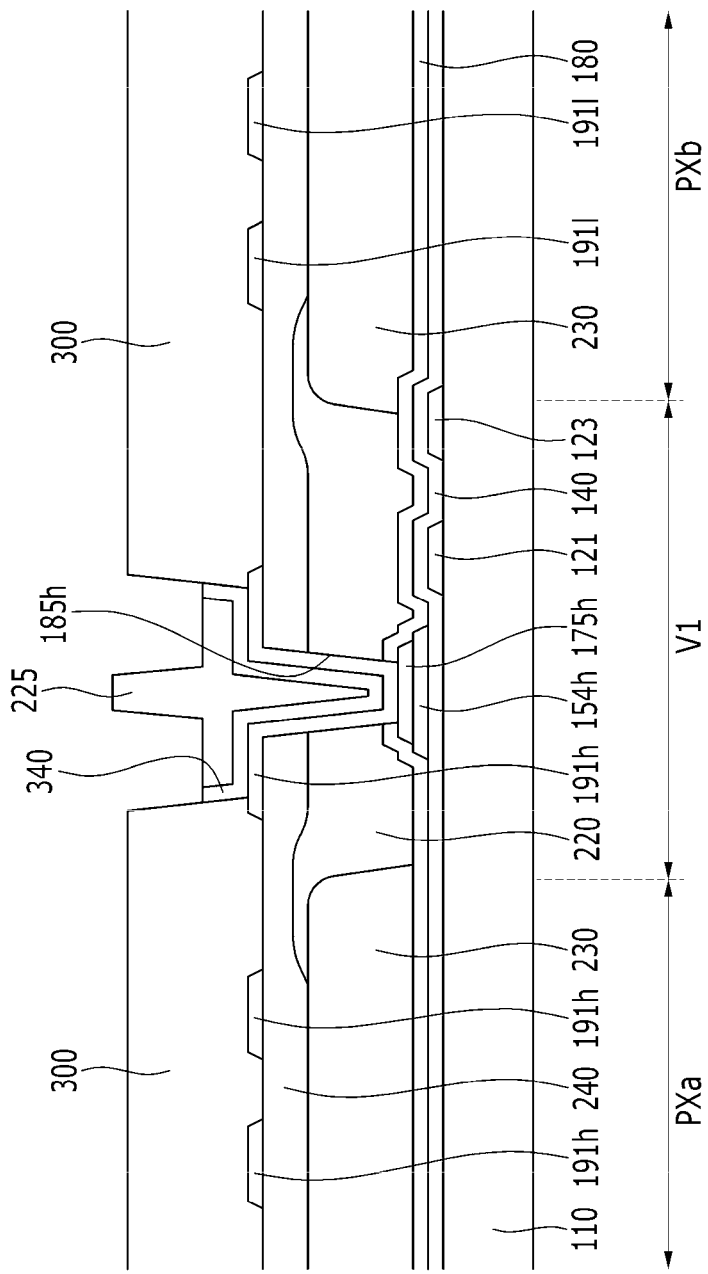

When the second light blocking member 225 is formed of a negative photosensitive material, the non-exposed portion of the second light blocking member 225 will be removed during development, while the exposed portion of the second light blocking member 225 remains. Accordingly, the non-exposed portion of the second light blocking member 225 on the sacrificial layer 300 will be removed, whereas the partially exposed and fully exposed portions of the second light blocking member 225 in the vicinity of the first contact hole 185*h* and the second contact hole 185*l* remain. As shown in FIG. 15, after the photolithography process, the portion of the second light blocking member 225 external to the peripheral portion of the first contact hole 185*h* and the second contact hole 185*l* has a lower thickness (relative to its original thickness), while the portion of the second light blocking member 225 overlapping with the first and second contact holes 185*h* and 185*l* retains most of its original thickness (in the form of a protrusion).

As previously described, the second light blocking member 225 has a greater height at the center than at the edge. Accordingly, light is effectively blocked at the center of the second light blocking member 225 due to the increased thickness at the center (in the form of the protrusion). Additionally, the height at the edge of the second light blocking member 225 is less than the height of the microcavity 305. Accordingly, in the embodiment of FIG. 15, the aligning agent and the liquid crystal material can flow more easily around the edge of the second light blocking member 225 due to the increase in flow surface area (capillary action).

Next, the second insulating layer 340 is patterned using the patterned second light blocking member 225 as a mask. Accordingly, the second insulating layer 340 may be formed having substantially the same pattern as a portion of the second light blocking member 225. As shown in FIG. 15, the second insulating layer 340 is disposed covering at least a lower surface and a side of the second light blocking member 225.

Figure 16:
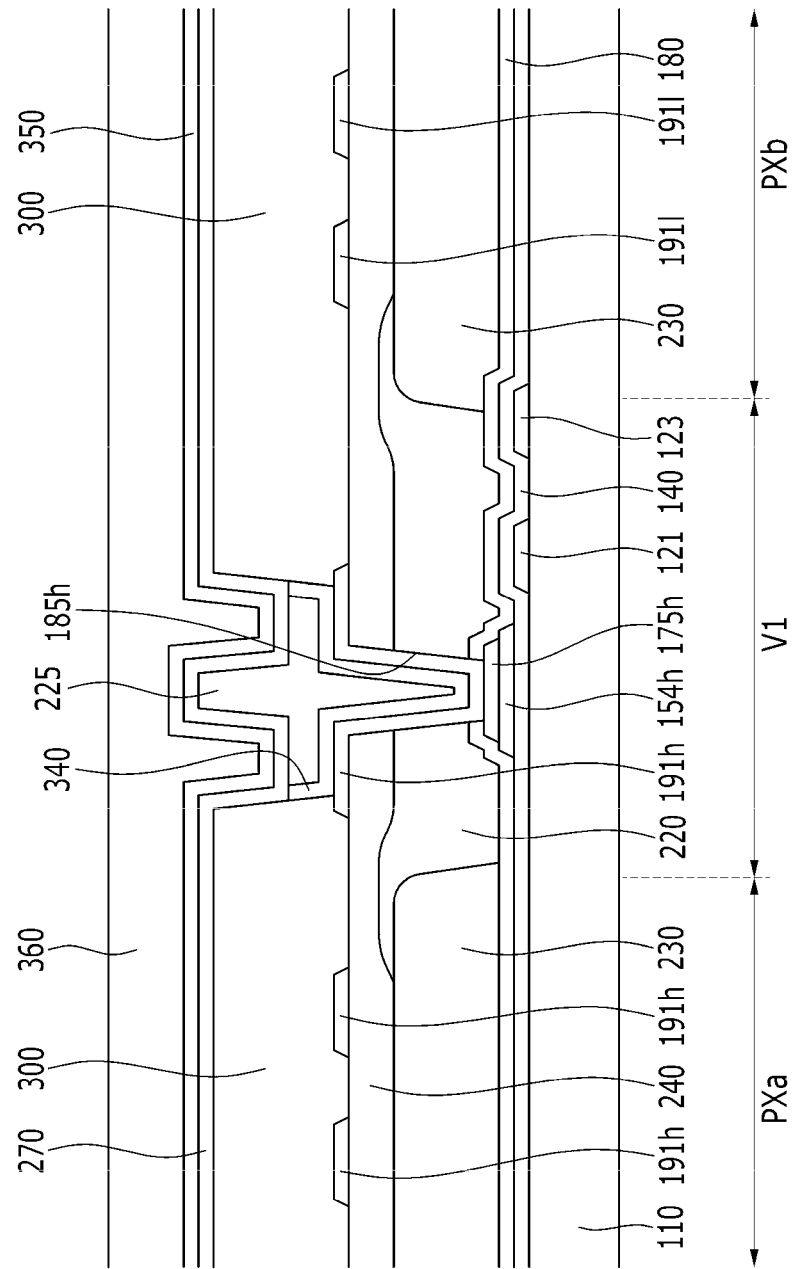

As illustrated in FIG. 16, a common electrode 270, a third insulating layer 350, and a roof layer 360 are sequentially deposited on the sacrificial layer 300 and the second light blocking member 225.

Figure 17:
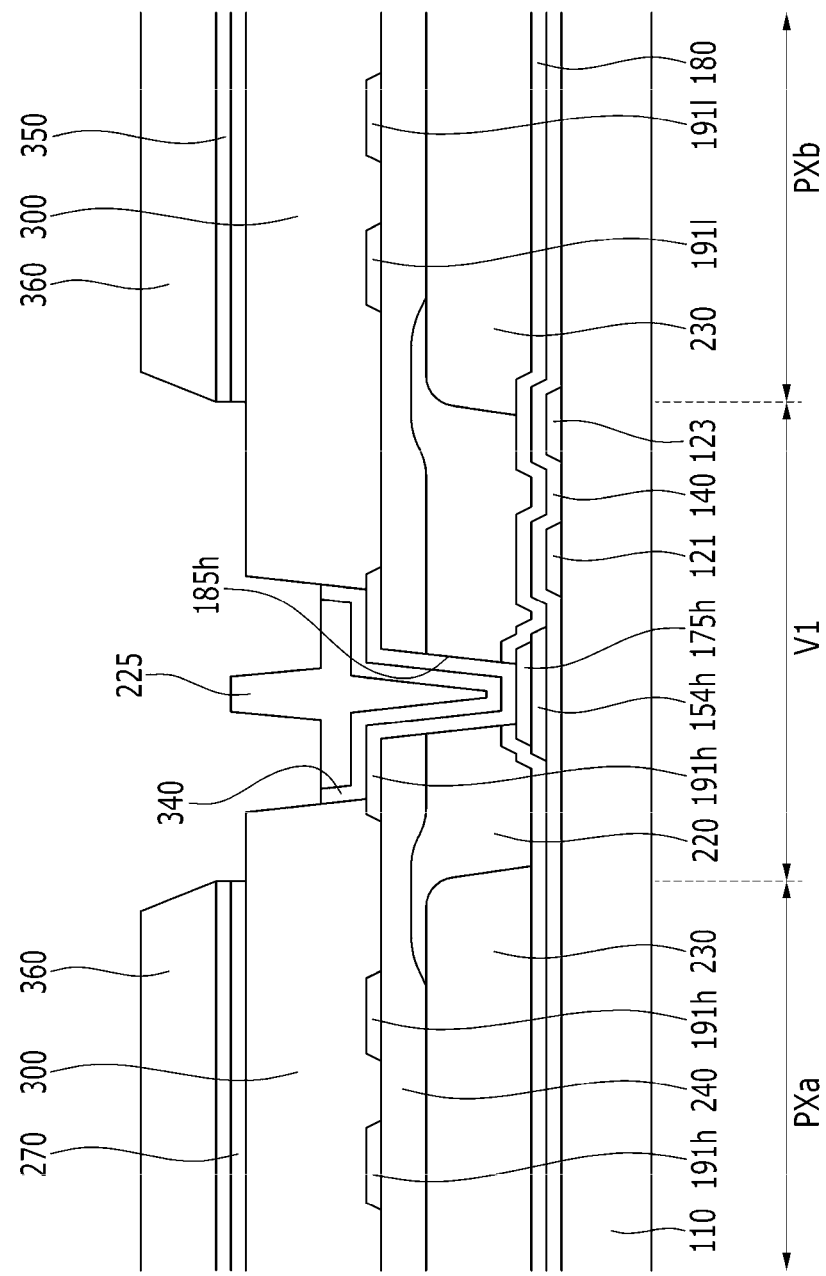

As illustrated in FIG. 17, the portion of the roof layer 360 disposed at the first valley V1 has been removed using a photolithography process. An injection hole 307 is formed by patterning the common electrode 270 and the third insulating layer 350 using the patterned roof layer 360 as a mask. (See FIG. 19).

It should be noted that when the second light blocking member 225 is disposed directly above the first and second thin film transistors Qh and Ql, and the common electrode 270 is formed on the second light blocking member 225, a secondary electric field effect may be generated on the first and second thin film transistors Qh and Ql, which may impact charging of the pixel. However, as shown in FIG. 17, the portion of the common electrode 270 originally disposed on the second light blocking member 225 has been removed. Accordingly, in the embodiment of FIG. 17, the secondary electric field effect on the first and second thin film transistors Qh and Ql can be reduced, thereby leading to smoother charging of the pixel.

Figure 18:
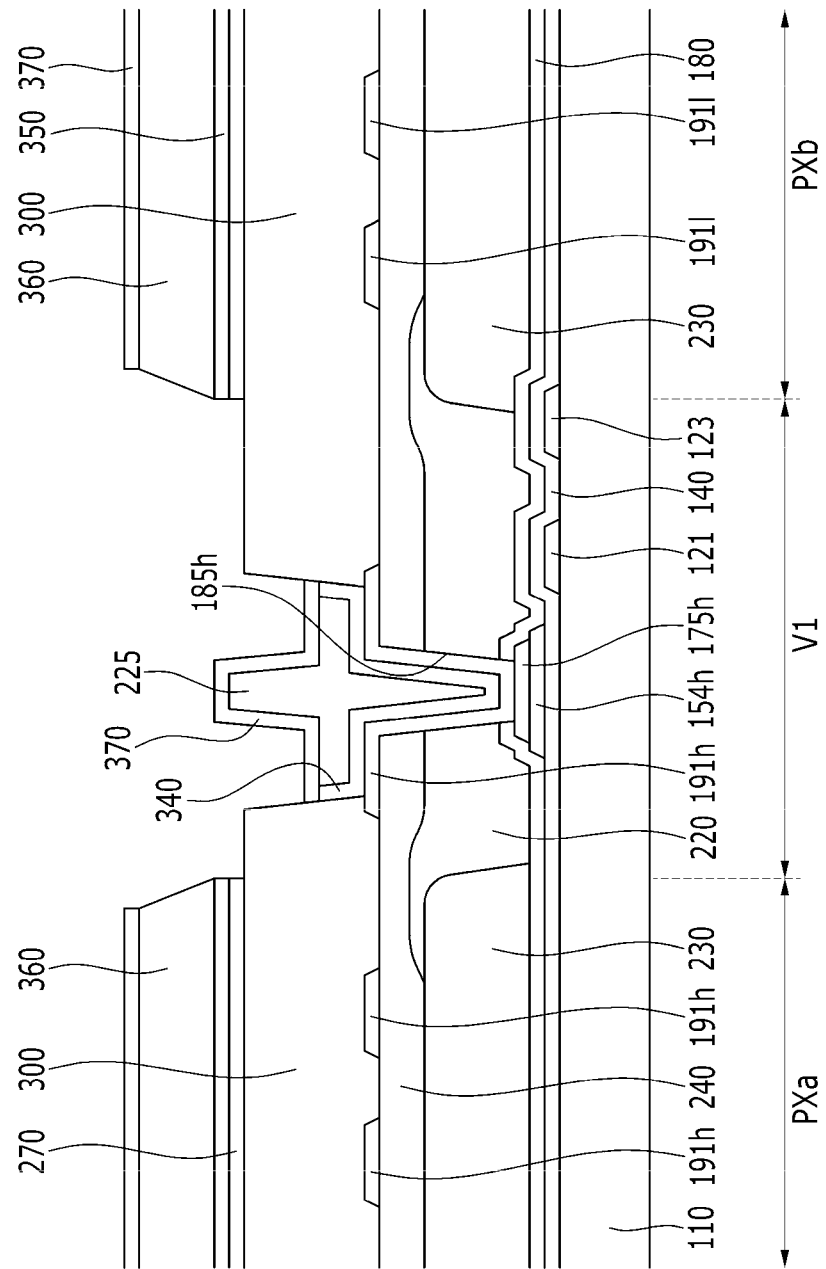

Referring to FIG. 18, a fourth insulating layer 370 is formed over the structure of FIG. 17. The fourth insulating layer 370 may be formed of an inorganic insulating material such as silicon nitride (SiNx) or silicon oxide (SiOx). Next, the portion of the fourth insulating layer 370 at the first valley V1 is removed, except for the portion of the fourth insulating layer 370 directly above the first contact hole 185*h* and the second contact hole 185*l*. As shown in FIG. 18, the fourth insulating layer 370 is disposed on the top surface of the roof layer 360 and the surface of the second light blocking member 225 (after the patterning of the fourth insulating layer 370).

Figure 19:
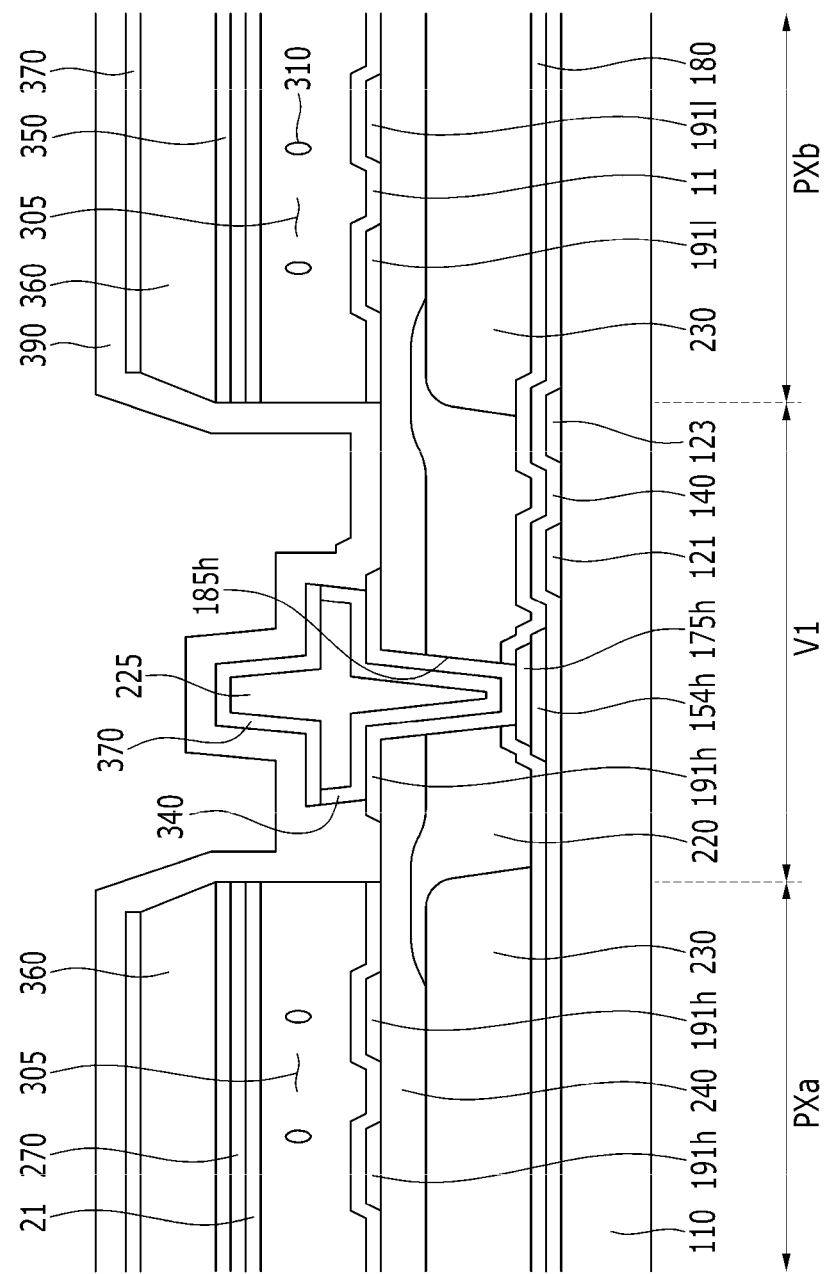

Referring to FIG. 19, the sacrificial layer 300 is removed by applying a developer and a stripping solution to the areas of the substrate 110 where the sacrificial layer 300 is exposed. In some embodiments, the sacrificial layer 300 may be removed using an ashing process. After the sacrificial layer 300 has been removed, a microcavity 305 is formed in the space where the sacrificial layer 300 was previously located.

Next, an aligning agent containing an alignment material is dispensed on the substrate 110 using a spin coating method or an inkjet method. The aligning agent flows into the microcavity 305 through the injection hole 307. After the aligning agent flows into the microcavity 305, a curing process is performed. The curing process causes the solution component of the aligning agent to evaporate, thereby forming first and second alignment layers 11 and 21 on the inner walls of the microcavity 305.

Next, a liquid crystal layer comprising liquid crystal molecules 310 is formed by dispensing liquid crystal material at the injection hole 307 so as to fill the microcavity 305 (similar to the steps previously described in FIG. 12).

Next, an encapsulation layer 390 is formed on the fourth insulating layer 370 covering the injection hole 307, so as to seal the microcavity 305.

Next, although not illustrated, polarizers may be further formed on the upper and lower sides of the display device.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the present disclosure.

What is claimed is:

1. A display device, comprising:
a substrate including a plurality of pixel areas;
a thin film transistor disposed on the substrate;
a first light blocking member disposed on the thin film transistor;
a contact hole disposed in the first light blocking member so as to expose at least a portion of the thin film transistor;
a pixel electrode disposed on the first light blocking member, and connected with the thin film transistor through the contact hole;
a second light blocking member disposed on the pixel electrode, the second light blocking member overlapping with the contact hole;
a roof layer disposed being spaced apart from the pixel electrode with a microcavity interposed therebetween;
an injection hole disposed below the roof layer to expose a portion of the microcavity;
a liquid crystal layer disposed in the microcavity; and
an encapsulation layer disposed on the roof layer covering the injection hole so as to seal the microcavity.

2. The display device of claim 1, wherein:
a height of the second light blocking member is less than a height of the microcavity.

3. The display device of claim 1, wherein:
a height at the center of the second light blocking member is greater than a height at an edge of the second light blocking member.

4. The display device of claim 3, wherein:
the height at the edge of the second light blocking member is less than a height of the microcavity.

5. The display device of claim 4, wherein:
the height at the center of the second light blocking member is at least the same as the height of the microcavity.

6. The display device of claim 1, further comprising:
a color filter disposed below the pixel electrode; and
a first insulating layer disposed on the color filter and the first light blocking member.

7. The display device of claim 6, further comprising:
a second insulating layer disposed between the pixel electrode and the second light blocking member.

8. The display device of claim 7, further comprising:
a common electrode disposed below the roof layer, wherein the common electrode is spaced apart from the pixel electrode with the microcavity interposed therebetween; and
a third insulating layer disposed between the common electrode and the roof layer.

9. The display device of claim 8, further comprising:
a fourth insulating layer disposed on the roof layer and the second light blocking member.

10. The display device of claim 1, wherein:
a member disposed on the second light blocking member is formed of a non-conductive material.

11. A method of manufacturing a display device, comprising:
forming a thin film transistor on a substrate;
forming a first light blocking member on the thin film transistor;
forming a contact hole by patterning the first light blocking member, so as to expose at least a portion of the thin film transistor;
forming a pixel electrode on the patterned first light blocking member, wherein the pixel electrode is connected with the thin film transistor through the contact hole;
forming a sacrificial layer on the pixel electrode;
patterning the sacrificial layer by removing a portion of the sacrificial layer overlapping with the contact hole;
forming a second light blocking member on the pixel electrode and the patterned sacrificial layer;
patterning the second light blocking member by removing a portion of the second light blocking member overlapping with the patterned sacrificial layer;
forming a roof layer on the patterned sacrificial layer and the patterned second light blocking member;
patterning the roof layer so as to form an injection hole for exposing a portion of the patterned sacrificial layer;
removing the patterned sacrificial layer so as to form a microcavity between the pixel electrode and the common electrode;
injecting a liquid crystal material into the microcavity so as to form a liquid crystal layer; and
forming an encapsulation layer on the patterned roof layer so as to seal the microcavity.

12. The method of claim 11, wherein the patterning of the second light blocking member further comprises:
exposing the second light blocking member using a slit mask or a halftone mask, so as to reduce a thickness of the portion of the second light blocking member overlapping with the contact hole.

13. The method of claim 12, wherein the second light blocking member comprises a negative photosensitive material, and
the slit mask or the halftone mask includes a non-transmitting region corresponding to the patterned sacrificial layer, and a half-transmitting region corresponding to the contact hole.

14. The method of claim 13, wherein a height of the patterned second light blocking member is less than a height of the microcavity.

15. The method of claim 11, wherein the patterning of the second light blocking member further comprises:
exposing the second light blocking member using a slit mask or a halftone mask, so as to reduce a thickness at an edge of the second light blocking member overlapping with the contact hole.

16. The method of claim 15, wherein the second light blocking member comprises a negative photosensitive material, and the slit mask or the halftone mask includes a non-transmitting region corresponding to the patterned sacrificial layer, a half-transmitting region corresponding to a peripheral portion of the contact hole, and a transmitting region corresponding to a center portion of the contact hole.

17. The method of claim 16, wherein a height at the edge of the patterned second light blocking member is less than a height of the microcavity.

18. The method of claim 11, further comprising:

forming a first insulating layer on the patterned first light blocking member;

forming a second insulating layer on the pixel electrode and the patterned sacrificial layer; and patterning the second insulating layer using the patterned second light blocking member as a mask.

19. The method of claim 18, further comprising:

forming a common electrode on the patterned sacrificial layer and the patterned second light blocking member;

forming a third insulating layer on the common electrode; and patterning the common electrode and the third insulating layer using the patterned roof layer as a mask, wherein the patterning of the common electrode and the third insulating layer comprises removing a portion of the common electrode and the third insulating layer formed on the patterned second light blocking member.

20. The method of claim 19, further comprising:

forming a fourth insulating layer on the patterned roof layer and the patterned second light blocking member.

\* \* \* \* \*